US011688756B2

(12) United States Patent
Goldstein et al.

(10) Patent No.: US 11,688,756 B2
(45) Date of Patent: Jun. 27, 2023

(54) SLOT ANTENNAS FOR GRAPHENE MID-IR IMAGING ARRAYS AS WELL AN APPROACH FOR CMOS IMPLEMENTATION THEREOF

(71) Applicant: Massachusetts Institute of Technology, Cambridge, MA (US)

(72) Inventors: Jordan Goldstein, Cambridge, MA (US); Dirk Robert Englund, Brookline, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 713 days.

(21) Appl. No.: 16/684,917

(22) Filed: Nov. 15, 2019

(65) Prior Publication Data

US 2020/0295075 A1    Sep. 17, 2020

Related U.S. Application Data

(60) Provisional application No. 62/792,548, filed on Jan. 15, 2019.

(51) Int. Cl.
*H01L 27/14* (2006.01)
*H01L 27/146* (2006.01)
(Continued)

(52) U.S. Cl.
CPC ..... *H01L 27/14649* (2013.01); *H01G 9/2004* (2013.01); *H01L 29/1606* (2013.01);
(Continued)

(58) Field of Classification Search
CPC combination set(s) only.
See application file for complete search history.

(56) References Cited

U.S. PATENT DOCUMENTS

| 9,799,817 B2 | 10/2017 | Fong et al. |
| 2015/0369660 A1 | 12/2015 | Yu |
| 2020/0309602 A1* | 10/2020 | El Fatimy ................. G01J 5/20 |

OTHER PUBLICATIONS

Bunea et al., "X band tunable slot antenna with graphene patch," 2015 European Microwave Conference (EuMC), Paris, 2015, pp. 614-617. doi: 10.1109/EuMC.2015.7345838. 4 pages.
(Continued)

*Primary Examiner* — Moin M Rahman
(74) *Attorney, Agent, or Firm* — Smith Baluch LLP

(57) ABSTRACT

A filter-based color imaging array that resolves N different colors detects only $1/N^{th}$ of the incoming light. In the thermal infrared wavelength range, filtering loss is exacerbated by the lower sensor detectivity at infrared wavelengths than at visible wavelengths. To avoid loss due to filtering, most spectral imagers use bulky optics, such as diffraction gratings or Fourier transform interferometers, to resolve different colors. Fortunately, it is possible to avoid filtering loss without bulky optics: detect light with interleaved arrays of sub-wavelength-spaced antennas tuned to different wavelengths. An optically sensitive element inside each antenna absorbs light at the antenna's resonant wavelength. Metallic slot antennas offer high efficiency, intrinsic unidirectionality, and lower cross-talk than dipole or bowtie antennas. Graphene serves at the optically active material inside each antenna because its 2D nature makes it easily adaptable to this imager architecture.

11 Claims, 16 Drawing Sheets

(51) Int. Cl.
H01L 29/16 (2006.01)
H01Q 21/06 (2006.01)
H04N 5/33 (2023.01)
H01G 9/20 (2006.01)
H10N 19/00 (2023.01)

(52) U.S. Cl.
CPC ............. *H01Q 21/064* (2013.01); *H04N 5/33* (2013.01); *H10N 19/00* (2023.02)

(56) References Cited

OTHER PUBLICATIONS

Cakmakyapan et al., "Gold-Patched Graphene Nanoribbons for High-Responsivity and Ultrafast Photodetection from Visible to Infrared Regimes." arXiv preprint arXiv:1710.00053 (2017). 33 pages.
Cakmakyapan et al., "Gold-patched graphene nano-stripes for high-responsivity and ultrafast photodetection from the visible to infrared regime." Light: Science & Applications 7.1 (2018): 20. 9 pages.
Castilla et al., "Fast and Sensitive Terahertz Detection Using an Antenna-Integrated Graphene pn Junction." Nano Letters 19.5 (2019): 2765-2773.
Chakraborty et al., "Optical antenna enhanced graphene photodetector." Applied Physics Letters 105.24 (2014): 241114. 5 pages.
Dragoman et al., "A tunable microwave slot antenna based on graphene." Applied Physics Letters 106.15 (2015): 153101.
Duan et al., "High thermoelectricpower factor in graphene/hBN devices." Proceedings of the National Academy of Sciences 113.50 (2016): 14272-14276.
Eggleston et al., "Ultra-Fast Spontaneous Emission from a Slot-Antenna Coupled WSe2 Monolayer." ACS Photonics (2018). 5 pages.
Fan et al., "Tunable mid-infrared coherent perfect absorption in a graphene meta-surface." Scientific reports 5 (2015): 13956. 12 pages.
Fang et al., "Enhanced graphene photodetector with fractal metasurface." Nano Letters 17.1 (2016): 57-62.
Fleischman et al., "High spectral resolution plasmonic color filters with subwavelength dimensions." ACS Photonics 6.2 (2019): 332-338.
Gabor et al., "Hot carrier-assisted intrinsic photoresponse in graphene." Science 334.6056 (2011): 648-652.
Graham et al., "Photocurrent measurements of supercollision cooling in graphene." Nature Physics 9.2 (2013): 103. 7 pages.
Grande et al., "Graphene-based perfect optical absorbers harnessing guided mode resonances." Optics Express 23.16 (2015): 21032-21042.
Guo et al., "Efficient electrical detection of mid-infrared graphene plasmons at room temperature." Nature Materials (2018): 1. 8 pages.
Hendrickson et al., "Wideband perfect light absorber at midwave infrared using multiplexed metal structures." Optics Letters 37.3 (2012): 371-373.

International Search Report and Written Opinion in International Patent Application No. PCT/US2019/061655 dated Feb. 10, 2020, 14 pages.
Inum et al., "Development of Graphene Based Tapered Slot Antennas for Ultra-Wideband Applications." Progress In Electromagnetics Research 79 (2017): 241-255.
Kim et al., "Electronically tunable perfect absorption in graphene." Nano Letters 18.2 (2018): 971-979.
Zhang et al., "Multispectral near-perfect metamaterial absorbers using spatially multiplexed plasmon resonance metal square structures." JOSA B 30.3 (2013): 656-662.
Li et al., "Modulation of mid-infrared light using graphene-metal plasmonic antennas." Applied Physics Letters 102.13 (2013): 131108. 6 pages.
Lu et al., "Highly efficient plasmonic enhancement of graphene absorption at telecommunication wavelengths." Optics Letters 40.15 (2015): 3647-3650.
Luxmoore et al., "Graphene-metamaterial photodetectors for integrated infrared sensing." ACS Photonics 3.6 (2016): 936-941.
Ma et al., "Integrated Graphene Plasmonic Slot Photodetector with High Responsivity." Integrated Photonics Research, Silicon and Nanophotonics. Optical Society of America, 2019. 2 pages.
Ma et al., "Plasmonically Enhanced Graphene Photodetector Featuring 100 Gbit/s Data Reception, High Responsivity, and Compact Size." ACS Photonics 6.1 (2018): 154-161.
Muench et al., "Waveguide-integrated, plasmonic enhanced graphene photodetectors." Nano Letters (2019). 14 pages.
Naishadham, "Design of a graphene loaded slot antenna with 100 : 1 bandwidth for wireless sensor applications." 2014 IEEE Antennas and Propagation Society International Symposium (APSURSI). IEEE, 2014. 2 pages.
Peng, 2D Materials Journal Club. MIT Quantum Photonics Group, Feb. 7, 2017, 10 pages.
Sefidmooye Azar et al., "Bull's eye grating integrated with optical nanoantennas for plasmonic enhancement of graphene long-wave infrared photodetectors." Applied Physics Letters 114.9 (2019): 091108. 6 pages.
Sherrott et al., "Experimental demonstration of> 230 phase modulation in gate-tunable graphene-gold reconfigurable mid-infrared metasurfaces." Nano Letters 17.5 (2017): 3027-3034.
Song et al., "Hot carrier transport and photocurrent response in graphene." Nano Letters 11.11 (2011): 4688-4692.
Tamang et al. "Color sensing by optical antennas: Approaching the quantum efficiency limit." ACS Photonics 6.8 (2019): 2041-2048.
Xiong et al., "Ultrabroadband, more than one order absorption enhancement in graphene with plasmonic light trapping." Scientific Reports 5 (2015): 16998. 8 pages.
Yao et al., "High-responsivity mid-infrared graphene detectors with antenna-enhanced photocarrier generation and collection." Nano Letters 14.7 (2014): 3749-3754.
Yao et al., "Mid-infrared graphene detectors with antenna enhanced light absorption and photo-carrier collection." 2014 Conference on Lasers and Electro-Optics (CLEO)-Laser Science to Photonic Applications. IEEE, 2014. 2 pages.
Zhang et al., "Graphene reconfigurable coplanar waveguide (CPW)-fed circular slot antenna." 2015 IEEE International Symposium on Antennas and Propagation & USNC/URSI National Radio Science Meeting. IEEE, 2015. 2 pages.

\* cited by examiner

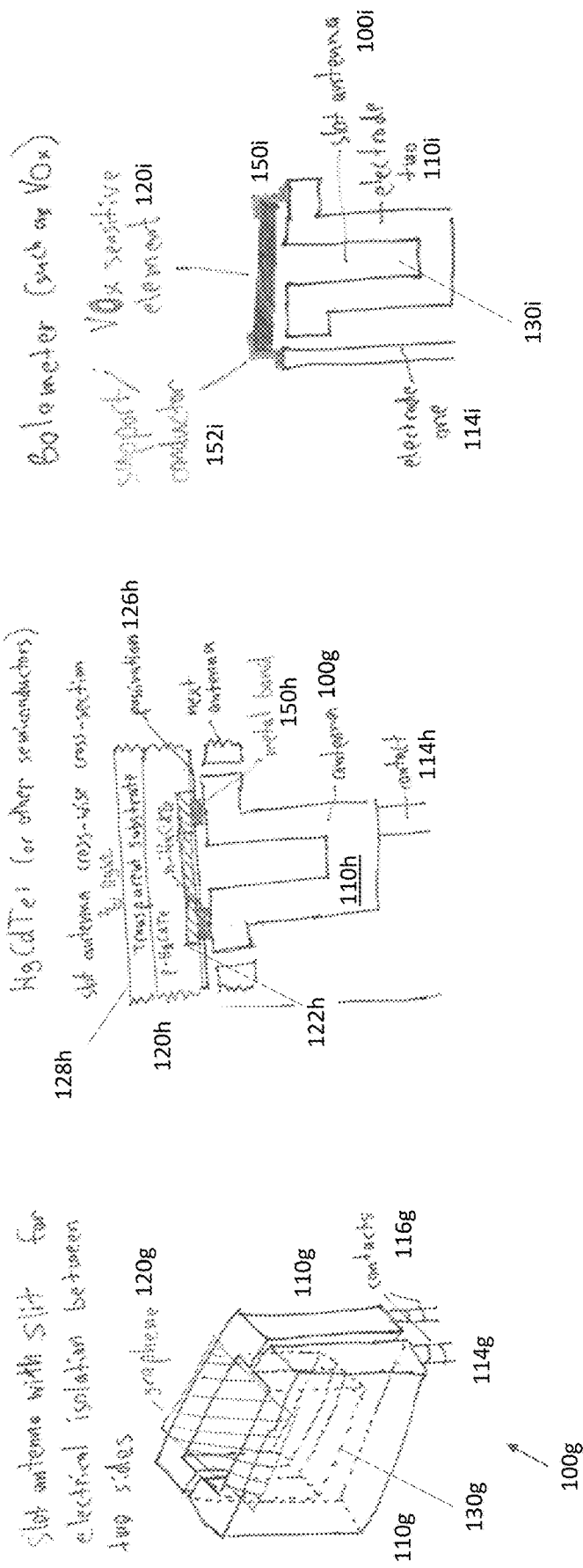

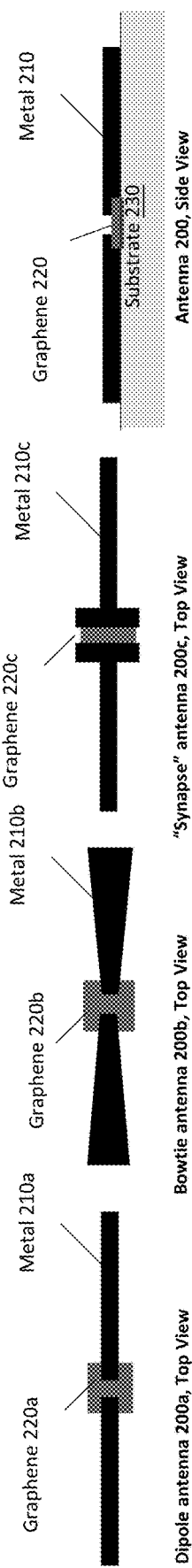

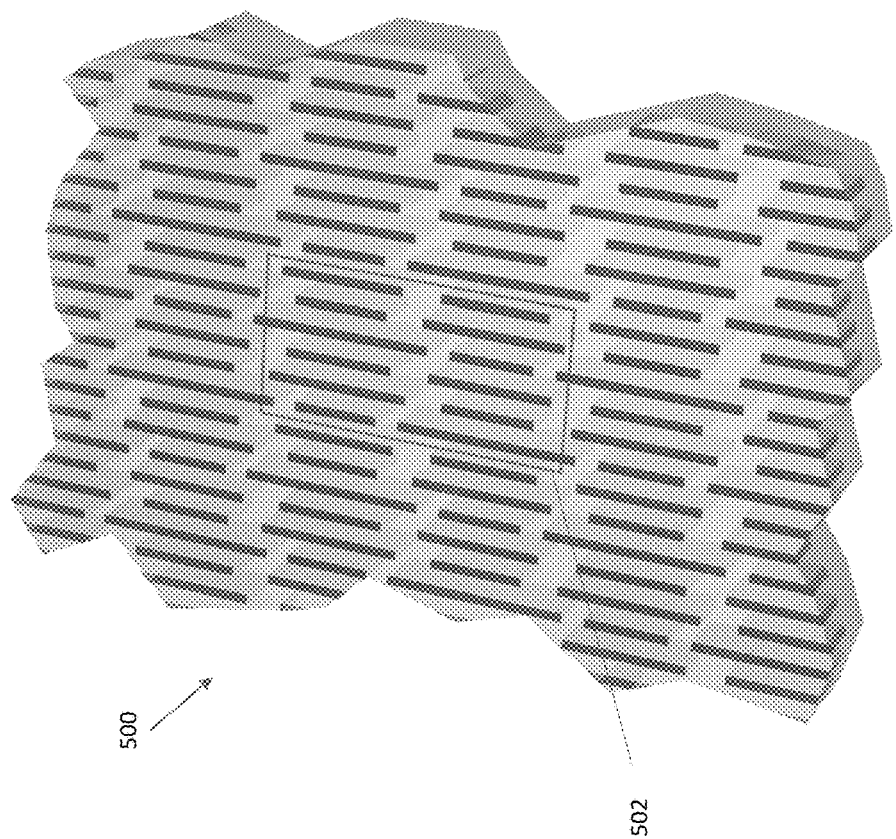
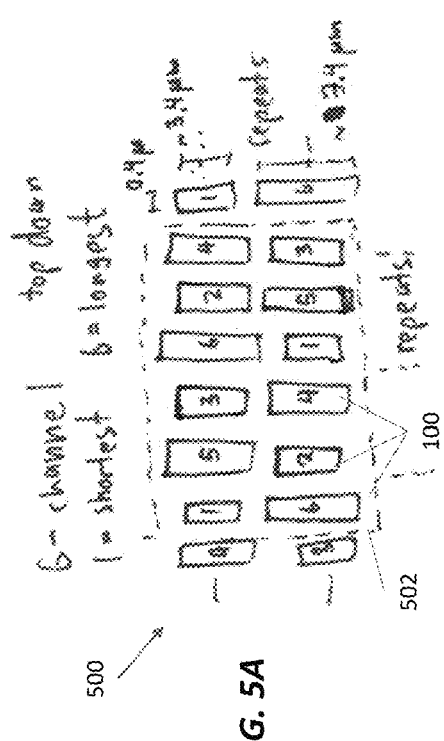
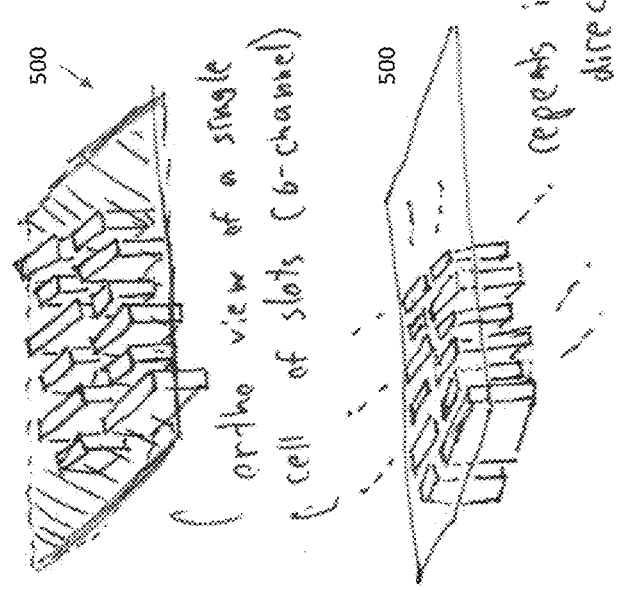
FIG. 5A
FIG. 5B
FIG. 5C
FIG. 5D

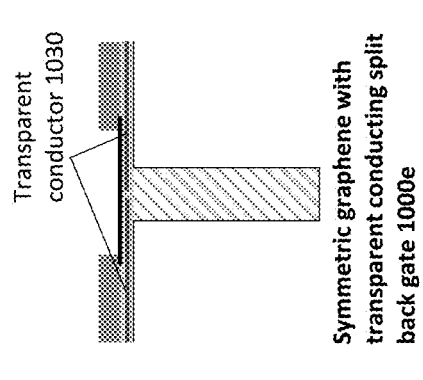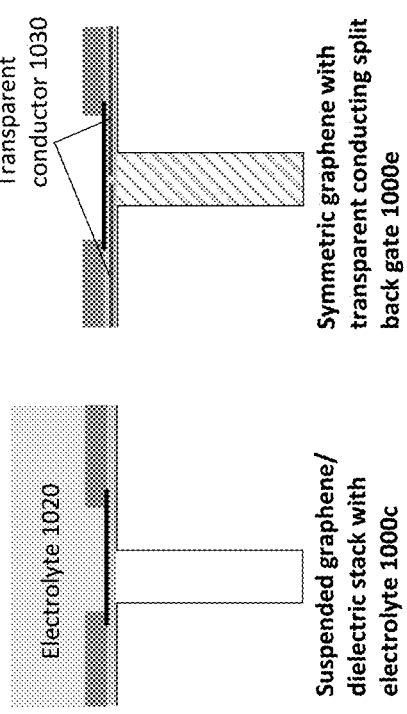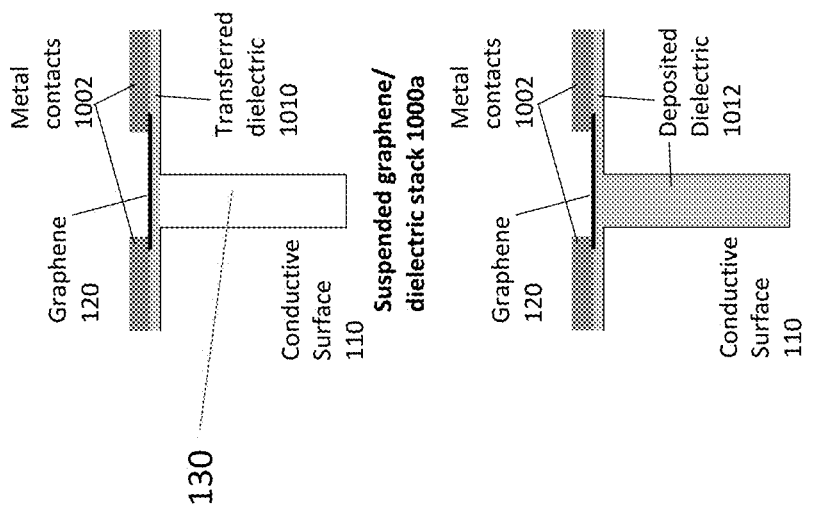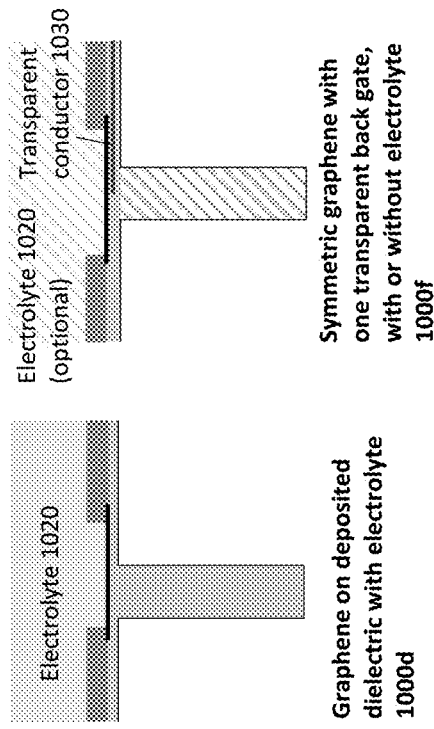

SLOT ANTENNAS FOR GRAPHENE MID-IR IMAGING ARRAYS AS WELL AN APPROACH FOR CMOS IMPLEMENTATION THEREOF

CROSS-REFERENCE TO RELATED APPLICATION(S)

This application claims priority, under 35 U.S.C. § 119(e), to U.S. Application No. 62/792,548, filed Jan. 15, 2019, which is incorporated herein by reference in its entirety.

GOVERNMENT SUPPORT STATEMENT

This invention was made with government support under W911NF-17-1-0435 and W911NF-18-2-0048 awarded by the U.S. Army Research Office. The government has certain rights in the invention.

BACKGROUND

Mid-infrared imaging has a wide range of applications, such as night vision, surveillance, remote chemical sensing, and medical diagnostics. However, no available mid-IR imagers simultaneously offer high sensitivity, high bandwidth and small size, with cooled detectors offering excellent performance at the cost of power, size and system complexity, while uncooled bolometers struggle with slow response times and low detectivity. Graphene is a promising alternative mid-IR sensitive optoelectronic material due to its broadband absorption, strong electrical response and wide process compatibility. However, its low absorption for normally incident light poses a challenge in designing high efficiency devices. Here, we propose to couple graphene with slot antennas, compact resonators which capture specific wavelengths of light and significantly enhance the free space to graphene light coupling efficiency. Additionally, since the antennas' footprints are much smaller than their absorption cross sections, multiple antennas with different resonant frequencies can be placed in close proximity, allowing broadband and spectrally selective photodetection.

It is easy to take spectrally resolved imaging for granted in daily life. Our own eyes are spectral imagers, and this functionality allows to infer not just geometry, but also to some extent the composition of what we see. The same can be said not just for visible light, but also for the infrared and terahertz sections of the electromagnetic spectrum in which chemicals feature characteristic absorption resonances. In particular, infrared spectrally resolved imaging has been used for such varied applications as gas emission monitoring, ecological monitoring, agriculture and food quality control, automatic waste sorting, biological research, and oceanography while terahertz spectrally resolved imaging has been used for drug and other chemical detection as well as diagnostic analysis of human tissue. The variety of such applications has driven the development of the various spectral resolved imaging technologies, covering various wavelength ranges, which are commercially available today.

Spectrally resolved imaging technologies can be roughly sorted into the categories of scanning and snapshot spectral imaging. The ultimate goal of spectral imaging is to measure a spectral "data cube," which represents light intensity as a function of two spatial dimensions and one spectral dimension. Scanning spectral imagers achieve this by sequentially measuring different portions of the data cube over time, and then combining the data from multiple exposures to form the full data cube.

One example of a scanning spectral imager is the push-broom scanner, in which light enters the device through a slit, passes through a prism or a grating that separates the light by wavelength and then images the resulting beam onto a focal plane array. This yields an array of spectra along one spatial dimension. The second spatial dimension is attained by physically scanning the entire device (or the imaged scene relative to the device), hence the name push-broom. Push-broom scanners are suitable for use on satellites or airplanes, where the imager is naturally moving, or for inspecting objects on a conveyor belt, where the scene is naturally moving. Another spectral imaging technique is to image a scene through a tunable filter, such as an etalon, a liquid crystal filter, or a Michelson-Morley interferometer, which essentially implements an imaging Fourier Transform Infrared (FTIR) spectrometer. While scanning spectral imagers have found their niches, they need either moving parts (which increases system complexity and failure rate) or linear relative motion between the camera and sensor, which imposes a limit on their application range.

Snapshot spectral imagers capture a data cube with a single exposure. Most snapshot spectral imagers operate either with absorptive spectral filters, dichroic filters, or dispersive optics to map the elements of a 3D data cube representing the input image onto one or a small number of focal plane arrays. A CMOS color camera may be considered as a filtering snapshot spectral imager in that each pixel is filtered (e.g., with a Bayer filter) to detect only red, green or blue light. Such systems incur a loss of throughput of 1/N, where N is the number of spectral channels. To compensate for this loss, they typically have proportionally larger apertures to collect more light.

In contrast, another category of spectral imagers uses optical systems containing dispersive elements or dichroic filters to break up an incoming light beam into multiple spectral channels or spatial cut-sections, each of which is imaged separately. The separate images are used to reconstruct the original scene. Although these spectral imagers don't suffer from the same light loss as filtering spectral imagers, splitting an optical beam into N different spectral channels invariably requires expanding the etendue of the optical system N-fold. Achieving this etendue typically involves reducing the input acceptance angle, as is the case with lenslet-based systems, or making the total focal plane array area considerably larger than the input aperture, as is the case with multispectral imagers based on dichroic beam splitters.

SUMMARY

Slot antenna elements and arrays of slot antenna elements with graphene patches over the slots can be used to detect mid-infrared light or Terahertz radiation. These devices can be made using CMOS fabrication techniques and integrated with CMOS electronics that read out the absorbed light as electrical signals. They feature faster response times than bolometers and add spectral selectivity while maintaining detectivities similar to those of more conventional room-temperature sensing elements.

An array of slot antennas can be part of an imaging system that detects infrared light at a first wavelength. Each slot antenna in the array of slot antennas includes a conductive material defining a three-dimensional slot resonant at the first wavelength; a graphene patch suspended over the three-dimensional slot in electrical communication with the conductive material; and a pair of electrical contacts in electrical communication with the graphene patch. The three-dimensional slot has a width, a length, and a depth, each of which can be less than the first wavelength. At least a portion of the conductive material may be formed as a mesh of conductive traces patterned in a complementary metal-oxide-semiconductor (CMOS) process. In operation, the conductive material couples the infrared light at the first wavelength into the graphene patch, and the electrical contacts sense a thermovoltage caused by absorption of the infrared light by the graphene patch.

The graphene patch may be offset with respect to the three-dimensional slot to introduce asymmetry into a Fermi level profile of the graphene patch. Alternatively, or in addition, there may be an electrolyte, a transparent conductor, or a dopant, in electrical communication with the graphene patch, to shift a Fermi level of the graphene patch.

Each slot antenna may be a first slot antenna and the array of slot antennas may be an array of first slot antennas, in which case the imaging system may also include an array of second slot antennas interleaved with the array of first slot antennas. This array of second slot antennas detects infrared light at a second wavelength different that the first wavelength. Each second slot antenna in the array of second slot antennas may include a conductive material defining a three-dimensional slot resonant at the second wavelength; a graphene patch suspended over the three-dimensional slot in electrical communication with the conductive material; and a pair of electrical contacts in electrical communication with the graphene patch. In operation, the conductive material couples infrared light at the second wavelength into the graphene patch, and the electrical contacts sense a thermovoltage caused by absorption of the infrared light at the second wavelength by the graphene patch. The arrays of first and second slot antennas can have pitches less than the first wavelength and less than the second wavelength.

An infrared imaging system with slot antennas can be made by forming an array of slot antennas, disposing a graphene patch over a three-dimensional slot in each slot antenna in the array of slot antennas, and coupling a pair of electrical contacts in electrical communication with each graphene patch. Forming the array of slot antennas may include patterning conductive vias to define the three-dimensional slots in a complementary metal-oxide-semiconductor (CMOS) back-end-of-line (BEOL) process. It can also include forming three-dimensional slots having different dimensions. The slot antennas can be formed by etching at least one three-dimensional slot in a conductive material or by etching at least one three-dimensional slot in a dielectric material and depositing a conductive material on the surface of the three-dimensional slot(s). And the electrical contacts can be coupled to the graphene patch by patterning metal via lithography to make electrical contact with the graphene patch.

A multi-spectral imaging system can sense mid-infrared light with a two-dimensional array of unit cells. The unit cell pitch is less than about 8 μm, with each unit cell in the array of unit cells comprising a plurality of different slot antennas. Each slot antenna in the plurality of different slot antennas is resonant at a different mid-infrared wavelength and has a graphene patch, disposed over a three-dimensional slot defined by a conductive material, to absorb light at that mid-infrared wavelength. Each slot antenna may have a resonance width of less than about 1 μm and an absorption cross section of about 4 μm$^2$ to about 40 μm$^2$, with the mid-infrared light in a wavelength range of about 6 μm to about 12 μm All combinations of the foregoing concepts and additional concepts discussed in greater detail below (provided such concepts are not mutually inconsistent) are part of the inventive subject matter disclosed herein. In particular, all combinations of claimed subject matter appearing at the end of this disclosure are part of the inventive subject matter disclosed herein. The terminology used herein that also may appear in any disclosure incorporated by reference should be accorded a meaning most consistent with the particular concepts disclosed herein.

BRIEF DESCRIPTIONS OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 1G shows a slot antenna with a slit that electrical isolates the two sides of the cavity.

FIG. 1H shows a cross section of slot antenna coupled to a HgCdTe patch.

FIG. 1I shows a cross section of slot antenna coupled to a VO$_x$ patch, e.g., for use as a heat sensing element in a bolometer.

FIGS. 2A-2D show "flat" antenna shapes for coupling incoming light to graphene patches.

FIGS. 5A-5D show different views of a 6-channel multispectral array of slot antennas coupled to a graphene patch.

FIGS. 10A-10F show different approaches for creating an asymmetric Fermi level profile in graphene used to produce a photovoltage.

DETAILED DESCRIPTION

Figure 1A:
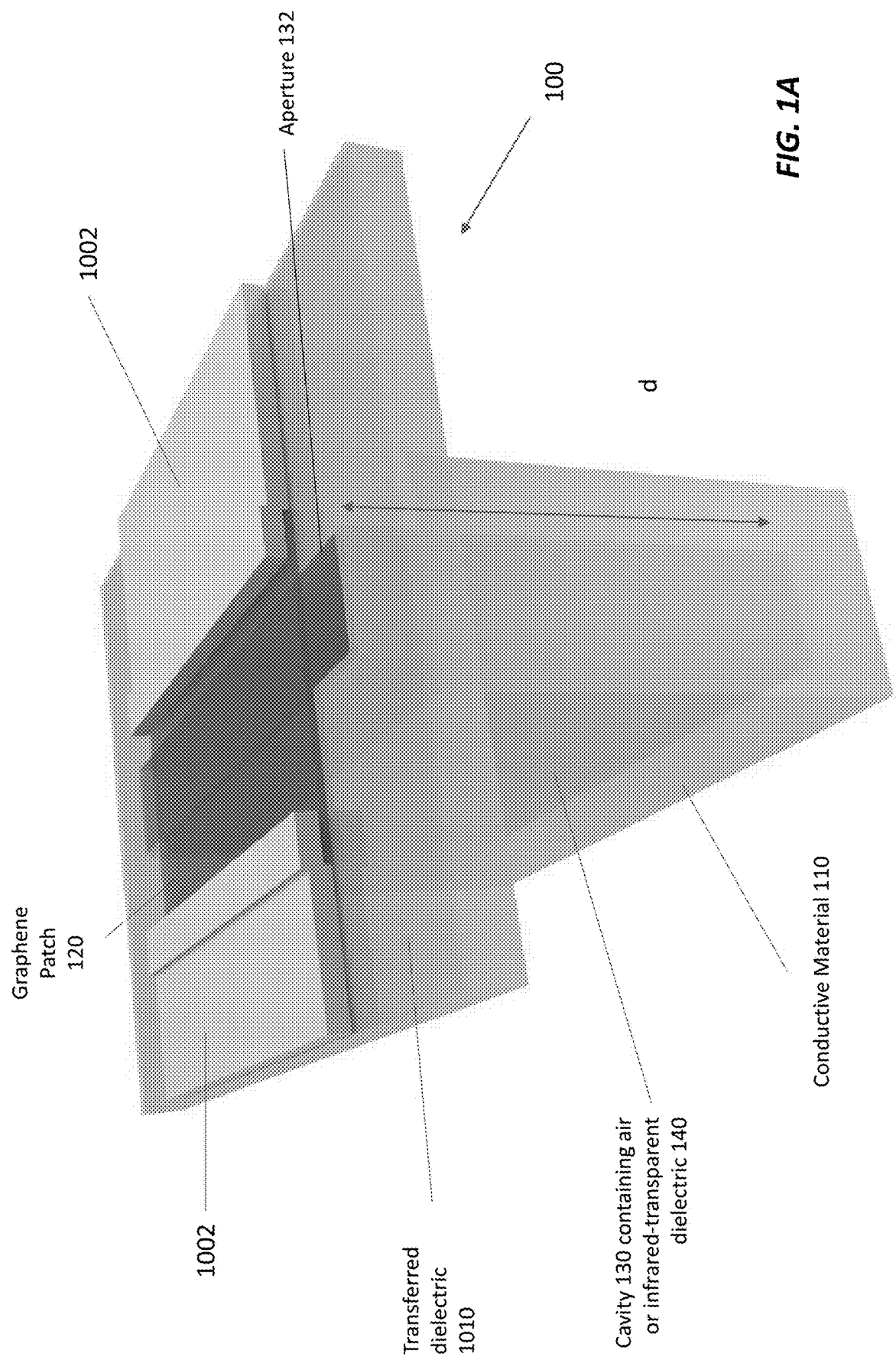
FIGS. 1A and 1B show orthographic and top views, respectively, of an individual slot antenna coupled to a graphene patch.

Using an array of differently-tuned slot antennas coupled to respective graphene patches can allow spectrally sensitive and efficient photodetection in the mid-infrared (IR) region of the electromagnetic spectrum thanks (1) the coupling efficiency between a slot antenna to a 2-dimensional (2D) material and (2) the small footprint of the slot antenna with respect to its absorption cross-section. Unlike other spectrally sensitive detectors, this array does not rely on color filter arrays which achieve spectral selectivity by filtering out and therefore wasting light. Instead, it uses the spectral selectivity and relatively large absorption cross section of each slot antenna to detect mid-IR light efficiently.

An inventive multispectral antenna array can be used for a wide range of mid- and thermal-IR imaging applications. (It can also be scaled to work at other wavelength ranges, including the near-IR and visible wavelength ranges.) The most intuitive of these imaging applications may be thermal imaging, encompassing night vision and surveillance, since objects near room temperature emit blackbody radiation around 10 μm with a brightness which varies as the fourth power of temperature. The standard technology for small, low-power or portable such systems is $VO_x$ or Si bolometry, a mature technology which is sensitive enough to discern temperature differences of less than 0.1 K.

An inventive multispectral antenna array offers at least three advantages over a conventional bolometer. First, unlike a conventional bolometer, an inventive multispectral antenna array can distinguish different wavelengths. This ability to spectrally distinguish light could be used to identify the temperature and composition information of objects in view. Or, in cases where the user can engineer the objects in view, a spectral marker could be incorporated onto objects whose temperature is of especial concern. Being able to see not just the total blackbody brightness but the spectrum as well allows accurate temperature measurement independent of changes in emissivity. Second, since the photothermoelectric effect is extremely fast, a multispectral antenna array has enough bandwidth to be used for artificial intelligence applications, such as robotics, where fast refresh rates and low latency are critical for real-time decision making. High bandwidth also allows chopping to eliminate flicker noise. Third, an inventive multispectral imaging array doesn't need the sophisticated and expensive vacuum packaging required by a bolometer.

Other applications for include remote chemical sensing, which utilize the absorption peaks of various gases (typically in the mid-IR) to "see" plumes of gas against a background of blackbody radiation, and medical diagnostics. For instance, a mid-IR multispectral antenna array could detect melanomas based on their signature in the mid-IR wavelength range. The possibility of producing mid-IR cameras with spectral resolution at low costs opens up the potential market of home health scanners.

Inventive antenna elements can be characterized by a number of different parameters, including:

Solid angle of emission $\Omega_G$: The spherical integral of an antenna or antenna array's radiation intensity divided by the maximum intensity among all radiation directions. For a point dipole, $\Omega_G = 8\pi/3$.

Absorption cross section $A_A$: Power absorbed by an antenna/load system divided by incoming light intensity, for light incident in the direction and polarization with the highest absorption. For slot antennas, this direction is normal to the substrate, and polarized perpendicular to the long side of the slot. (For the slot antenna element 100 in FIGS. 1A and 1B, the load is the graphene patch 120.)

Active cross section $A_L$: Power absorbed by the load in an antenna/load system divided by incoming light intensity, for light incident in the direction and polarization with the highest absorption. In the absence of ohmic loss in the antenna element, $A_L = A_A$.

Geometric cross section (also known as effective aperture) $A_G$: $A_L$ for an antenna design assuming no ohmic loss (thus=$A_A$), in the case where the load is conjugate impedance matched to the antenna; that is, for which the load impedance is chosen to maximize such cross-section. $A_G = \lambda^2/\Omega_G$, where $\lambda$ is the wavelength of the incident radiation. More generally, the geometric cross section represents the antenna's absorption cross section without any ohmic loss and a load impedance selected to give conjugate impedance matching. The geometric cross section captures only those properties of the antenna which arise due to the antenna's shape, which is intricately related to the antenna's radiation pattern.

Antenna receiving efficiency $\eta_L$: the ratio of the active cross section to the geometric cross section, $\eta_L = A_L/A_G$. An antenna which meets the criteria in the definition of $A_G$ has $\eta_L = 1$. Realistic antennas have ohmic loss and imperfect impedance matching and thus $\eta_L < 1$.

Note the following subtlety in these terms: The antenna impedance, and hence conjugate matched load impedance, is wavelength-dependent, but in the definition for $A_G$, the load is assumed to be conjugate matched for each wavelength. Hence $A_G$ is independent of the load, and as such it can be related to the load-independent solid angle of emission, $\Omega_G$. In contrast, the absorption cross section $A_A$, active cross section $A_L$, and antenna receiving efficiency $\eta_L$ are defined with fixed loads, so they feature resonances as a function of wavelength. The wavelength of an antenna element's first-order resonance is called its resonant wavelength, $\lambda_r$, and is the largest wavelength that maximizes the absorption cross section $A_A$. This active cross section $A_L$ and antenna receiving efficiency $\eta_L$ also depend on wavelength and are also at or near their maxima at the resonant wavelength, $\lambda_r$.

Three-Dimensional Antenna Elements with 2D Material Patches

Figure 1B:
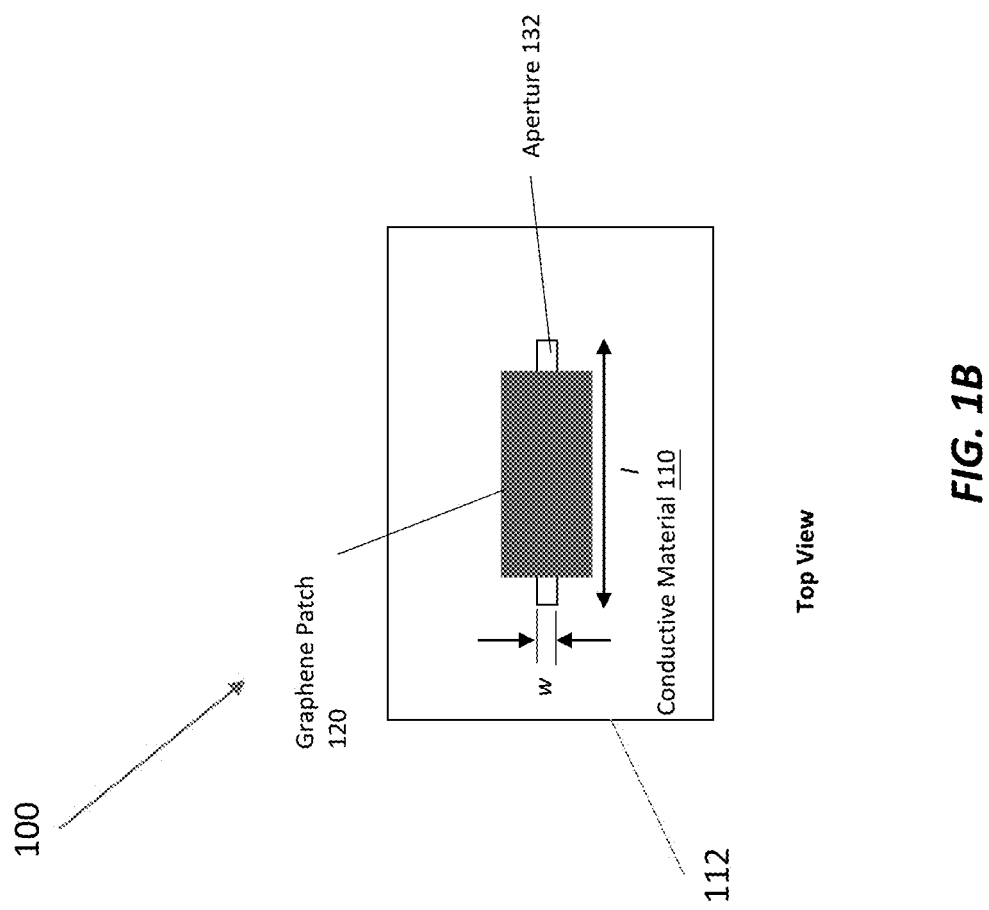

FIGS. 1A and 1B show orthographic and top views, respectively, of a slot antenna element 100 that can detect mid-IR light (e.g., light with a wavelength range of 6-12 μm, including ranges of 6-10 μm or 7-12 μm). The slot antenna element 100 is formed of a conductive material 110, such as metal or a heavily doped semiconductor, that defines a three-dimensional (3D) slot or cavity 130 fabricated on a semiconductor or dielectric substrate (e.g., a silicon substrate; not shown).

The conductive material 110 extends over at least a portion of the cavity's surface and has a thickness equal to about 3-4 times its skin depth at the slot antenna element's operating wavelength to prevent light leakage. This cavity 130 has a width w, a length l, and a depth d, each of which can be varied to adjust the spectral sensitivity of the slot antenna element 100. For example, the cavity may be about 400 nm wide, about 3 μm to about 8 μm long, and about 1.5 μm to about 3 μm deep for an operating wavelength of about 6 µm to about 10 µm. Similarly, the shapes of the cavity 130 and conductive material 110 may be selected based on the antenna element's desired receptivity pattern. If desired, the cavity 130 may be partially or completely filled with a dielectric material 140 that is transparent at the slot antenna element's operating wavelength.

The cavity's width and height define an aperture 132 that is surrounded by an apron 116 of conductive material 110. The aperture 132 in FIGS. 1A and 1D is rectangular, but other aperture shapes are also possible, including square, polygonal, circular, elliptical, crosses, and irregular shapes. A patch 120 of monolayer or bilayer graphene, HgCdTe, vanadium oxide ($VO_x$), black phosphorus (e.g., for sensing light at wavelengths near 3 µm), transition metal chalcogenides (e.g., for sensing near-infrared or visible light), colloidal quantum dots, thin semiconductor quantum well structure, or another 2D material on a transferred dielectric 1020 is suspended across the aperture 132 and over the cavity 130. More generally, the patch 120 should include material that is sensitive in the desired wavelength range where the absorptive region is localized to the near field of the antenna 100. The patch 120 in FIGS. 1A and 1B is rectangular and has a width that is greater than the width of the cavity 130 and aperture 132 and less than the width of the apron 116. The graphene patch's length is less than the length of the cavity 130 and aperture 132. Electrical contacts 1002 contact the patch 120 close to the optical absorption region for measuring changes in the thermovoltage across the patch 120 caused by absorption of incident light.

In operation, the slot antenna element 100 couples mid-infrared light into the graphene patch 120. At mid-infrared wavelengths, the graphene patch 120 can be modeled as an infinitely thin sheet with a sheet resistance of at least 16.4 k$\Omega$/□. This high resistance makes conjugate matching difficult, and antenna design in this case benefits from care.

Simulations of the slot antenna element 100 in FIGS. 1A and 1B show an antenna receiving efficiency at the resonant wavelength $\eta_{L,r}$ up to 0.35 at $\lambda_r$=9.2 µm for slots with w=400 nm, l=6.5 µm, and d=2.25 µm. Other simulations show an antenna receiving efficiency of $\eta_{L,r}$=0.48 at $\lambda_r$=6 µm for slots with w=240 nm and d=1.5 µm using slot antennas like those in FIGS. 1C and 1D with the perforations shown in FIG. 11 (discussed below). Generally, simulations show that slot antennas with resonant wavelengths from 4-8 µm can have very high efficiencies of 0.45-0.55 for input apertures between 100-200 nm wide and a few 100 nm long that expand out to internal cavities with widths of 400-600 nm, lengths greater than 4 µm (e.g., up to 5.25 µm long), and depths of 1-2 µm, with shallower cavities favoring shorter resonant wavelengths.

For gold slot antennas loaded with graphene patches operating in the mid-IR, the absorption cross section is on the order of 10 µm$^2$, although this scales with $\lambda^2$ and may vary over even an octave. The ratio of the slot antenna element's active cross section to its absorption cross section $A_L/A_A$ (that is, the ratio of absorbed light which is absorbed in the graphene) can be in the range of 0.4-0.6, which indicates the slot geometry does not incur additional ohmic loss compared to planar dipole antennas. This demonstrates that good antenna efficiency can be achieved using a slot antenna design, and without pushing lithographic limits.

The slot antenna's "built-in" ground plane is another fundamental advantage. As described below, an array of closely spaced, lossless, conjugate-matched slot antenna elements can fully absorb a properly polarized normally incident beam of light. The same cannot be said for an array of planar antennas because they lack a ground plane. In this latter case, a reflector can be buried a distance of $\lambda$/4 (a so-called "Salisbury screen"), but due to the wavelength specificity this is not a broadband solution.

Figure 8:
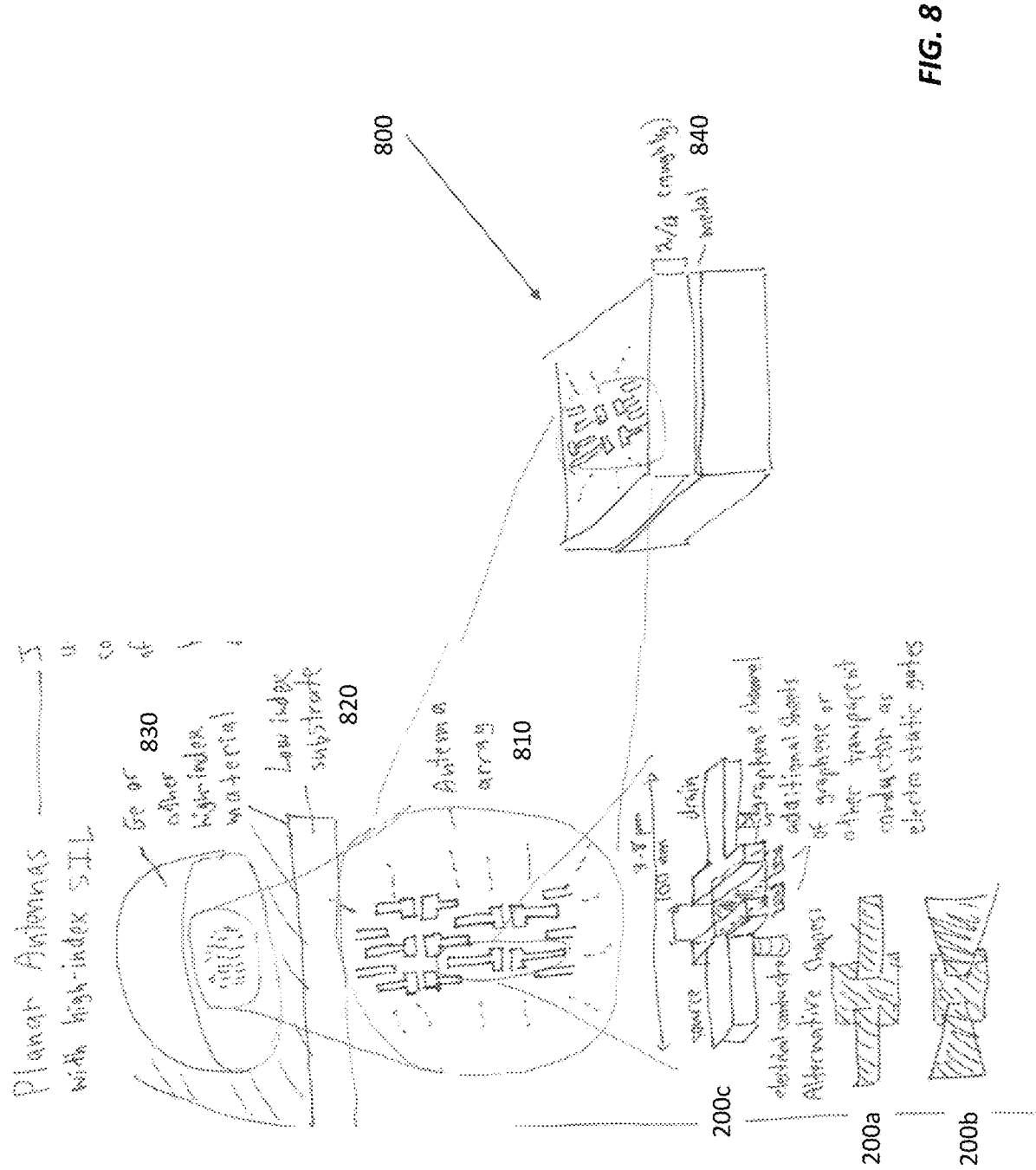
FIG. 8 shows planar antennas with a refractive index contrast to suppress coupling in one direction.

Put differently, in a broadband antenna metasurface detector with planar antennas, the planar antennas emit light both up and down. By electromagnetic reciprocity, the planar antennas cannot absorb 100% of a beam of light coming in from one direction. One way around this problem is to have a much higher refractive index in the desired incident light direction (e.g., down), as shown in FIG. 8 (described below). Another way to increase absorption is to put a ground plane about a quarter wavelength below the antennas. Based on the theory of dielectric thin films, this causes the metasurface to "see" an open circuit below it, so that it only interacts with the space in above it. Because the slot antenna has a built-in ground plane, its radiation pattern is unidirectional as a result of its geometry, so reciprocity does not impede it ability to absorb 100% of a beam incident in one direction.

FIGS. 1C-1I show variations of the basic slot antenna design. FIGS. 1C and 1D shows cross-sectional and orthographic views, respectively, of a slot antenna 100c with a cavity 130c having a narrowed entrance slit/aperture 132c. (This type of slot antenna is also called a cavity antenna.) The narrowed entrance slit 118c concentrates electric fields near the graphene patch 120, while the wider cavity 130c below the entrance slit 112c reduces ohmic loss in the metal or other conductive material 110c that defines the cavity 130c and entrance slit 118c.

Figure 1F:
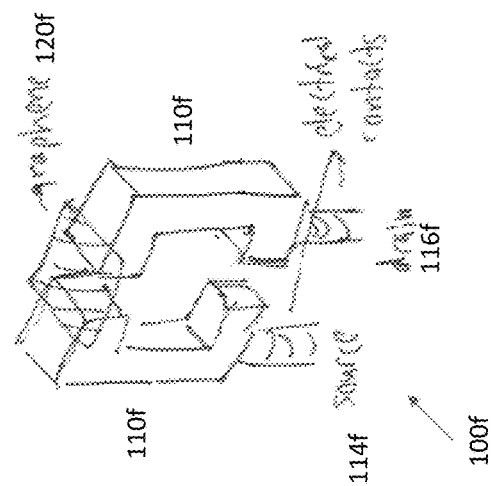
FIGS. 1E and 1F show antennas with graphene patches and nonzero magnetic polarizabilities.
Figure 1E:
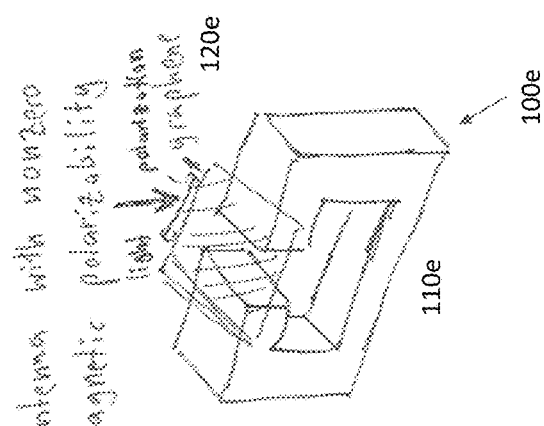
Figures 1C, 1D:
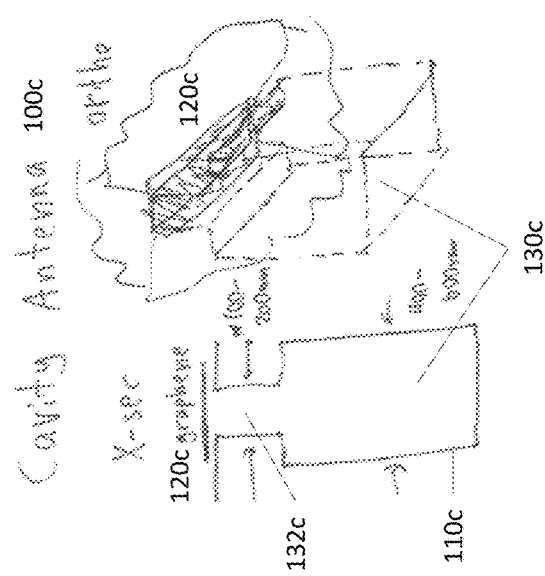
FIGS. 1C and 1D shows cross-sectional and orthographic views, respectively, of a slot antenna with a graphene patch over a narrowed entrance slit to a three-dimensional cavity.

FIGS. 1E and 1F show slot antennas 100e and 100f, respectively, with non-zero magnetic polarizabilities. The slot antenna 100e in FIG. 1E has conductive material 110e formed roughly in a "C" shape, with a graphene patch 120e suspended across the gap in the "C" from the two arms of the "C." Similarly, the slot antenna 100f in FIG. 1F has conductive material 110f formed in mirrored "C" shapes, with gaps between the "C" shapes. One "C" shape is connected to a source electrode 114f, and the other is connected to drain electrode 116f. A graphene patch 120f bridges the top gap. When these slot antennas 100e and 100f are suspended in a dielectric, they can be engineered to absorb an entire incident plane wave with no radiation in the −z direction.

FIG. 1G shows an orthographic view of a slot antenna 100g with a slit that electrically isolates conductive material 110g on opposite sides of the cavity 130g. This slot antenna 100g supports a resonance, which may be shifted due to the capacitance across the slit. Electrical isolation between the two sides of the antenna 100g allows the graphene patch 120g to contact source and drain electrodes 114g, 116g or gating electrodes that are separated from the graphene patch 120g by a thin layer of dielectric material (not shown).

FIG. 1H shows a cross section of a slot antenna 100h with an epitaxial HgCdTe patch 120h instead of a graphene patch for sensing mid-IR radiation. The HgCdTe patch 120h is bonded to the slot antenna's conductive material 110h with one or more metal bonds 150h. These metal bonds 150h extend through a passivation layer 126h on the underside of the HgCdTe patch 120h. A thin region 122h of the HgCdTe patch 120h bordering the metal bonds 150h is n-doped and the rest of the HgCdTe patch 120h is p-doped to form a pn junction. And a transparent substrate 128h on the top of the HgCdTe patch 120h transmits mid-IR radiation and protects the HgCdTe patch 120h. The HgCdTe patch 120h can be replaced with an InSb, InGaAs, or Si patch for detecting light at other wavelengths, including near-IR wavelengths.

FIG. 1I shows a cross section of a slot antenna 100i with a thermal bolometer element, such as a $VO_x$ or amorphous silicon (a-Si) patch 120i, suspended over the cavity 130i. A pair of conductive contacts 150*i* and 152*i* support the VO$_x$ or a-Si patch 120*i* above the cavity 130*i*. One contact 150*i* connects the VO$_x$ or a-Si patch 120*i* to the conductive material 110*i* that forms the antenna cavity 130*i*, and the other contact 152*i* connects the VO$_x$ or a-Si patch 120*i* to another metal via 114*i*. This metal via 114*i* and the conductive material 110*i* serve as electrodes that measure changes in the resistance of the VO$_x$ or a-Si patch 120*i* caused by absorption of incident infrared radiation.

FIGS. 2A-2D show different views of "flat" antennas 200*a*-200*c* (collectively, antennas 200) that couple light to patches of graphene or other 2D materials: FIG. 2A shows a top view of a dipole antenna 200*a* with a graphene patch 220*a* bridging a gap between two rectangular metal segments 210*a*; FIG. 2B shows top view of a bowtie antenna 200*b* with a graphene patch 220*b* bridging a gap between two trapezoidal metal segments 210*b*; FIG. 2C shows a synapse antenna 200*c* with a graphene patch 220*c* in a gap between two T-shaped metal segments 210*c*; and FIG. 2D shows a side view of all the antennas 200 with the metal 210 and graphene on a transparent substrate 230 (omitted from FIGS. 2A-2C for clarity).

In each antenna 200, the metal 210 is patterned in a thin layer (e.g., roughly 50 nm to 100 nm tall) on the transparent substrate 230. Adopting reasonable fabrication resolution constraints (metal spacing>100 nm) gives an antenna receiving efficiency at the resonant wavelength $\eta_{Lr}$ of about 0.12 at a resonant wavelength $\lambda_r$=6.8 μm assuming intrinsically doped graphene 220 with no thermal Pauli blocking (that is to say, the ideal $R_\square$=16.4 kΩ/□ case). A higher antenna receiving efficiency $\eta_{Lr}$ favors narrower, shorter (in the vertical direction) antennas 200 with narrow gaps between the two arms. Of the designs shown in FIGS. 2A-2C, the synapse antenna 200*c* has the lowest lateral aspect ratio of the graphene patch 220*c*. This lower lateral aspect ratio means that the graphene patch 220*c* presents a lower impedance to the antenna 200*c*, improving the antenna receiving efficiency at the resonant wavelength $\eta_{Lr}$.

Monochromatic Antenna Arrays

Figure 3:
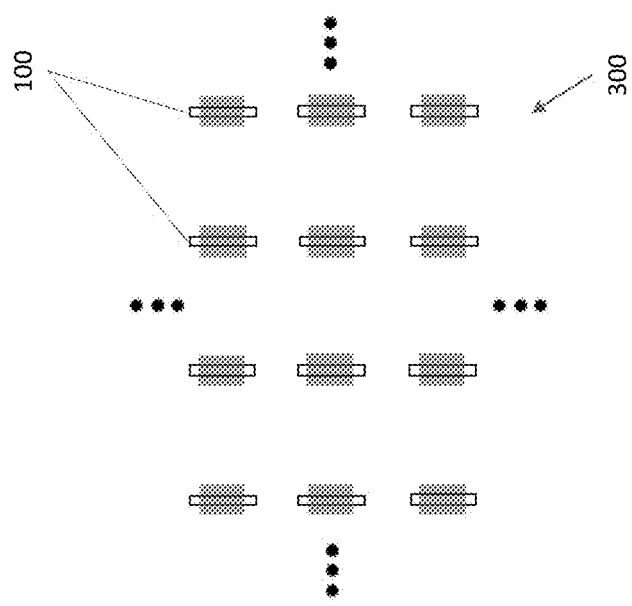
FIG. 3 shows a monochromatic array of slot antennas coupled to a graphene patch.

FIG. 3 shows a monochromatic antenna array 300 composed of slot antenna elements 100 arrayed on a square lattice. The slot antennas are monolithically integrated with CMOS readout circuitry, so the array is formed on the silicon substrate out of metal in back-end-of-the-line CMOS fabrication steps. Alternatively, the substrate can be a dielectric and the logic (circuitry) can be implemented in graphene or carbon nanotube transistors. The device can also be fabricated "upside down", starting with a mid-IR transparent substrate followed by the sensitive element (e.g., graphene), then the slots or some other antenna structure, then flip-bonded to another chip with the digital logic.

The slot antenna elements 100 are identical—they have slots 130 (FIGS. 1A and 1B) with identical dimensions—so their resonance wavelengths are the same. The antenna pitch on the square lattice is equal to or less than the resonance wavelength, e.g., half the resonance wavelength. Each slot antenna element 100 has its own graphene patch 120 and can be conjugate-matched to a corresponding antenna, which may have an impedance of 500-1000 ohms on resonance.

Under certain conditions, a 2D lattice of antennas like the monochromatic antenna array 300 in FIG. 3 can fully absorb an incoming beam of light. This can be intuited in the context of reciprocity by imagining that each slot antenna radiates light instead of receiving light. Imagine that each slot is not terminated in a short (a cavity), but rather fed with electromagnetic waves from the inside in such a way that each antenna's theoretical "source" deep down inside the structure sees a conjugate-matched load. This is the opposite of actual operation, where the antennas are absorbing light, but yields insight about the antenna's receptivity pattern from its emission (diffraction) pattern.

More specifically, consider a 2D lattice of lossless antennas fed with impedance transformers to conjugate-match the antennas with 50-ohm feeds (here, the impedance of the feeds is arbitrary and can be matched to the antennas' radiation impedance). The antennas in the array are fed with a signal of amplitude $\exp(i\vec{k}_{xy} \cdot \vec{r})$, where $\vec{k}_{xy}$ is the desired lateral wavevector component of the radiated beam and $\vec{r}$ is the antenna position. The amplitude is the amplitude of the field emitted from each antenna as a function of its position. If $|\vec{k}_{xy}+\vec{q}|>2\pi/\lambda$ for all reciprocal lattice vectors $\vec{q}$ of the antenna array except for $\vec{q}=0$, then the antenna radiation has no higher-order diffraction modes—that is, the radiated light forms a plane wave. Since an array of slot antennas emits in one half-plane, feeding an array of slot antennas with a signal of amplitude $\exp(i\vec{k}_{xy} \cdot \vec{r})$ forms a single uniform beam. By Lorentz reciprocity, if such a beam is redirected back at this same antenna array, the light should be funneled losslessly and without reflection into the 50-ohm feeds. Therefore, an antenna lattice's reciprocal lattice basis vectors $\vec{q}_a$ and $\vec{q}_b$ define a set of incoming light directions $\vec{k}_{xy} \in K$ which experience perfect absorption.

For a square lattice of antennas with spacing λ, K includes the point $\vec{k}_{xy}$=0. For a square lattice with spacing λ/2, e.g., as shown in FIG. 3, K includes all $\vec{k}_{xy}$ with $|\vec{k}_{xy}| \le 2\pi/\lambda$; that is, all possible plane waves of wavelength λ. This illustrates that if slot antennas are small enough to accommodate close spacing, are lossless, and have conjugate-matched loads, they can absorb an entire incoming light beam, neglecting coupling between adjacent antennas. Planar antennas cannot achieve such perfect absorption without a back-reflector because they also radiate into the substrate when used as emitters. In practice, the loads may not be perfectly matched to the slot antennas and there may be ohmic loss. In this case, the proportion of beam energy absorbed in the slot antenna array's loads is the antenna receiving efficiency $\eta_L$. The remaining energy is reflected or converted to heat.

Polychromatic/Multispectral Antenna Arrays

Depending on its footprint, there may considerable empty space in a monochromatic antenna array with K covering the desired acceptance angle. The remaining space can be used to superimpose additional monochromatic antenna arrays with different resonant wavelengths. The resulting superimposed monochromatic antenna arrays from a polychromatic or multispectral antenna array. Care should be taken for the arrangement of the antennas in both space and frequency-space. The antennas should not be placed tightly enough to interfere with their near-field current profiles, nor should the antennas' resonances overlap considerably (e.g., the overlap point for neighboring antennas should less than or equal to half the resonance amplitude). Antennas with partially overlapping absorption spectra may be spatially separated by about one wave-radian (λ/2π), as this represents the spatial extent of the near-field. Antennas without overlapping absorption spectra can be packed more tightly that one wave-radian without shifting the antennas' resonances.

If the antennas' resonances overlap too much, light absorption at a given wavelength is no longer dominated by one or two monochromatic sub-arrays. Similarly, if the antenna pitch is too small, the received light spreads out among multiple sub-arrays, wasting physical space that could otherwise be used to extend the antenna array's total wavelengths range.

Figure 4:
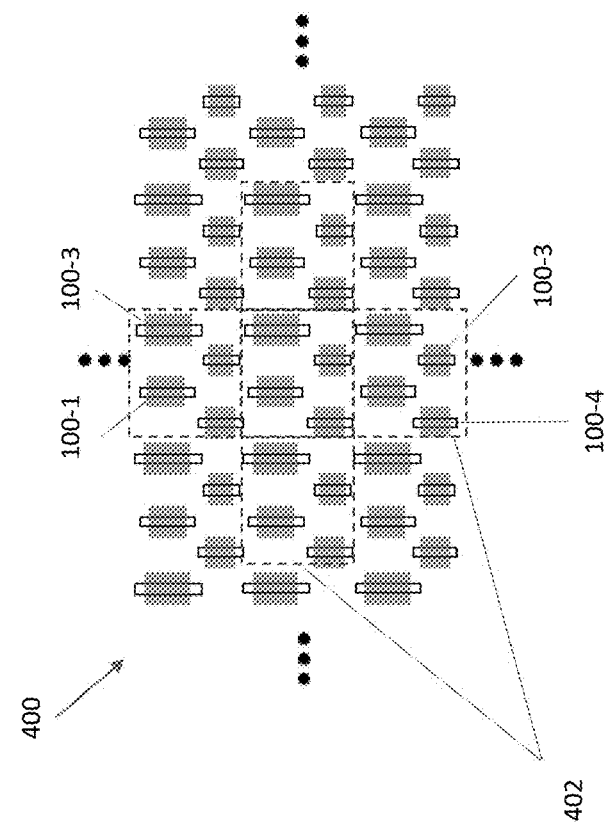
FIG. 4 shows a multispectral array of slot antennas coupled to a graphene patch.

FIG. 4 shows a four-channel multispectral antenna array 400 composed of square unit cells 402, each of which includes four slot antenna elements 100-1, 100-2, 100-3, and 100-4 (collectively, slot antennas elements 100) like those shown in FIGS. 1A and 1B. The antenna elements 100 have different slot dimensions and hence different resonance wavelengths. In this case, the resonance wavelengths span a band in the mid-IR region of the electromagnetic spectrum (e.g., 6-12 µm).

The square unit cells 402 are arranged on square lattice with a pitch of about $\lambda_{r,max}/2$, where $\lambda_{r,max}$ is the resonance wavelength of the antenna element 100 with the longest resonance wavelength. (Practically, the pitch may deviate from $\lambda_{r,max}/2$, e.g., due to fabrication imperfections or space constraints, with any deviation having little to no effect on antenna performance depending on the acceptance angle of the overall optical system.) From a different perspective, the multispectral antenna array 400 can be thought of as four interleaved monochromatic antenna arrays (i.e., one for each type of antenna element 100-1 through 100-4), each of which is on square lattice with a pitch of $\lambda_{r,max}/2$, where the square lattices are offset from each by $\lambda_{r,max}/4$ in the x, y, or x and y directions.

FIGS. 5A-5E illustrate a six-channel multispectral antenna array 500 with six different types of slot antenna elements 100-1 through 100-6 arranged on a rectangular lattice. FIGS. 5A-5D show different views of the multispectral antenna array 500, which has a unit cell 502 that repeats in the place of the array 500. The slots 130 in the slot antenna elements 100 have the same width (about 0.4 µm) but different lengths, with slot antenna element 100-1 having the shortest slot length (about 3.4 µm) and slot antenna element 100-6 having the longest slot length (about 7.4 µm). The antenna pitch is about 7 µm in the widthwise direction and about 12.666 µm in the lengthwise dimensions.

Figure 5E:
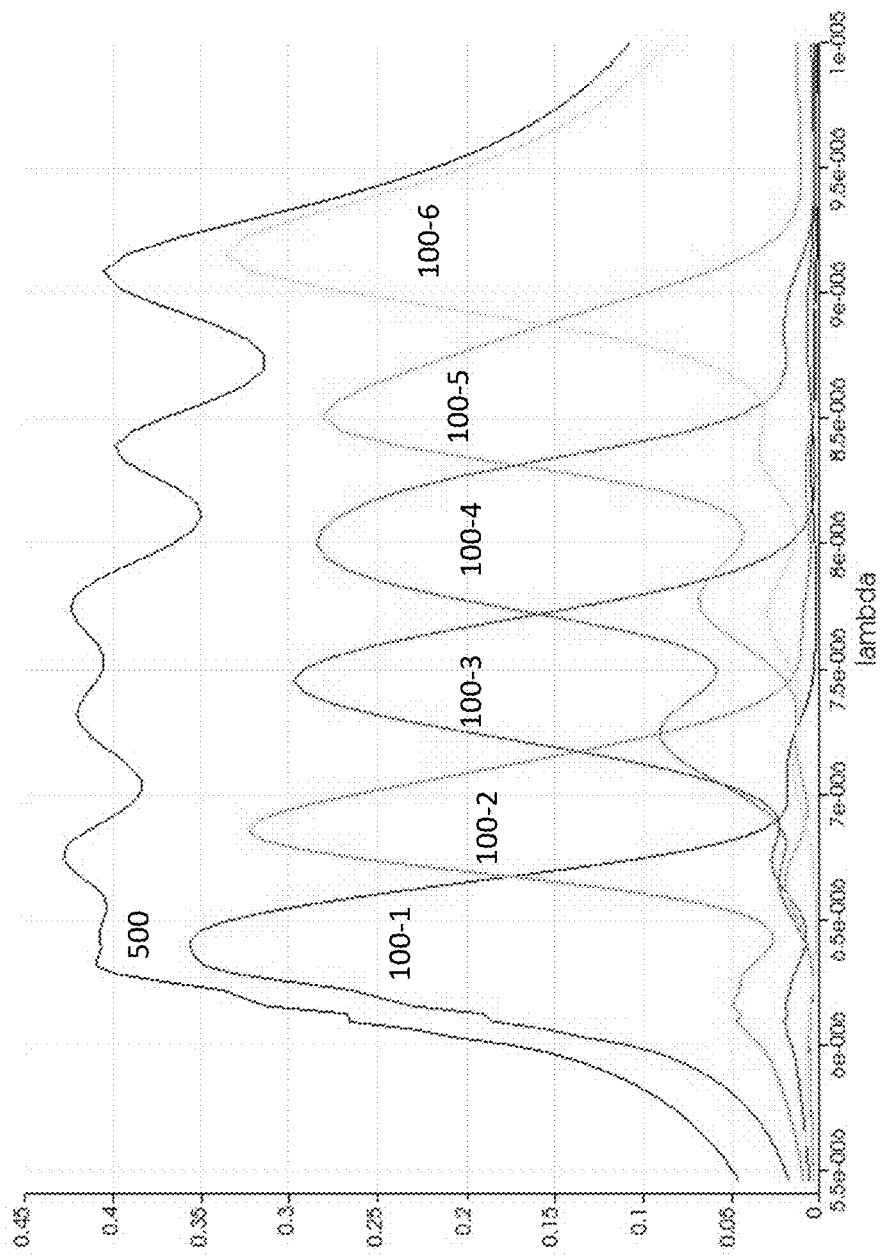
FIG. 5E is a plot of the simulated absorption spectra for a 6-antenna unit cell like the one shown in FIGS. 5A-5D.

The slot lengths set the slot antenna elements' resonance wavelengths, so the slot antenna element 100-6 with the longest slot has the longest resonance wavelengths as shown in FIG. 5E, which is a plot of the resonances for each antenna element 100-1 through 100-6 and for the entire array 500. The resonances have roughly equal full-width half-maxima (FWHM) (about 1 µm each) and together span a wavelength range of about 6 µm to about 10 µm, with adjacent resonances separated by about 0.8 µm. The slot antenna elements 100 are arranged so that slot antenna elements with adjacent resonances are not next to each other in the unit cell 502. In FIG. 5A, the slot antenna elements are arranged linearly in the following repeating pattern: 100-1, 100-5, 100-3, 100-6, 100-2, 100-4, 100-1, 100-5, 100-3, 100-6, 100-2, 100-4, and so on. Spatially separating antenna elements 100 with adjacent resonances increases the probability that incoming light will be absorbed by the antenna element most sensitive at that wavelength.

Figure 6:
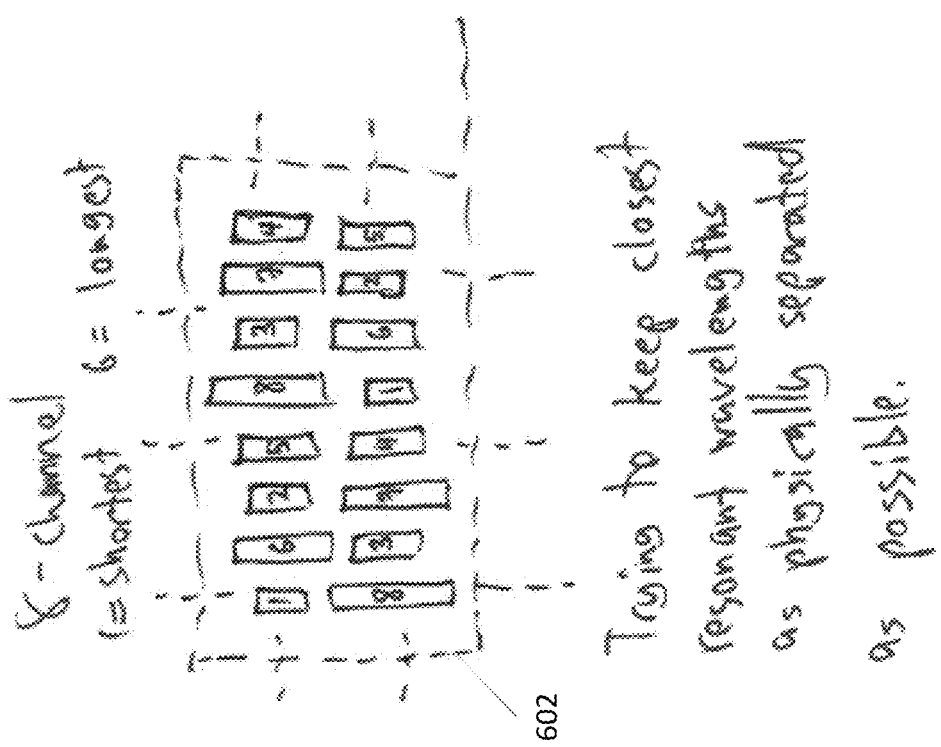
FIG. 6 shows an 8-channel multispectral array of slot antennas coupled to graphene patches.

Other multispectral antenna arrays are also possible. For example, a multispectral antenna array may have more slot antenna elements, e.g., as in FIG. 6, which shows one unit cell 602 of a multispectral antenna array with eight different slot antenna elements, each of which has a different slot length and a different resonance wavelength. (The slot antenna elements may have different depths and widths as well.) A multispectral antenna array may have different arrangements of antenna elements, including sparse arrays and non-rectilinear arrays, as well as different types of antenna elements, including any of those shown in FIG. 1C-1I or 2A-2D. A multispectral antenna array can also have slot antenna elements with different loads (e.g., different combinations of graphene, HgCdTe, or a-Si patches) for sensing light at different wavelengths.

Figure 7:
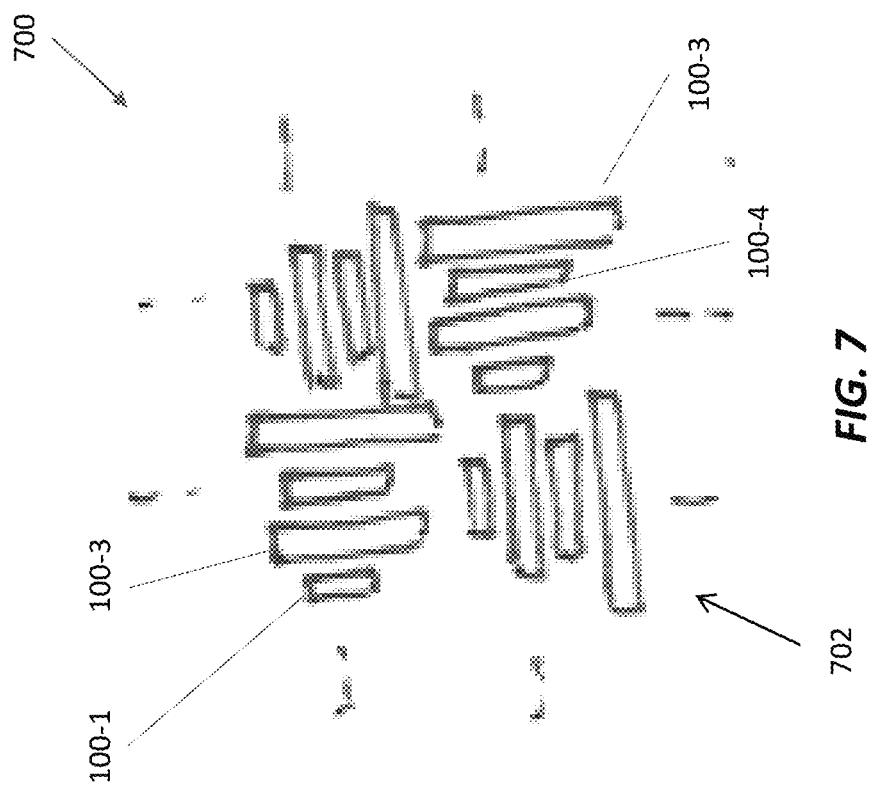
FIG. 7 shows a multispectral array of slot antennas coupled to graphene patches and arranged to detect light of different polarizations.

FIG. 7 shows a multispectral antenna array 700 with rotated slot antenna elements 100-1 through 100-4 to sense light projected into orthogonal (e.g., vertical and horizontal) polarizations. In this multispectral antenna array 700, each unit cell 702 includes four slot antenna elements 100-1 through 100-4 aligned with the long axes of the slots parallel to each other. Each unit cell 702 is rotated 90° with respect to its neighboring unit cells 702. Since the slots' orientations determines the slot antenna elements' polarization sensitivity, arranging slots to be perpendicular to each other by rotating half the unit cells 702 enables the array 700 to sense both vertically and horizontally polarized light.

The multispectral antenna array 700 is sensitive to light in every polarization state, including unpolarized light. Its sensitivity depends on how tightly the antenna elements 100 are packed together. If the unit cells 702 are arrayed at a pitch of half a wavelength, then rotating the antenna elements 100 with respect to each other shouldn't affect the array's sensitivity. In practice, fabrication and loss constraints may limit how closely the antennas are spaced.

Planar Antenna Arrays

FIG. 8 shows an imager 800 with an array 810 of planar antennas 200 like those shown in FIGS. 2A-2D. The planar antennas 200 may be tuned to the same resonance wavelength for sensing monochromatic radiation or to different resonance wavelengths for sensing polychromatic radiation. They may be oriented in one direction or in different directions depending on the desired polarization sensitivity.

In any case, the planar antenna array 810 is formed on a low-index substrate 820 and covered with or encapsulated by a higher-index material 830, such as germanium. If desired, the high-index material 830 may be curved or patterned to form a solid immersion lens (SIL) that focuses incident mid-IR light on the planar antenna array 810. The index contrast between the low-index substrate 820 and the high-index SIL 830 reduces bidirectional coupling (i.e., coupling in the ±z directions) that affects many planar antennas by suppressing the interaction between the antennas 200 and the far field in the −z direction.

The imager 800 may also include a λ/4 back-reflector 840 to enhance absorption in the antennas 200. The electrical contacts to the antennas 200 are channeled through the low-index dielectric 820 and back-reflector 840.

Terahertz Antenna Arrays

Figure 9B:
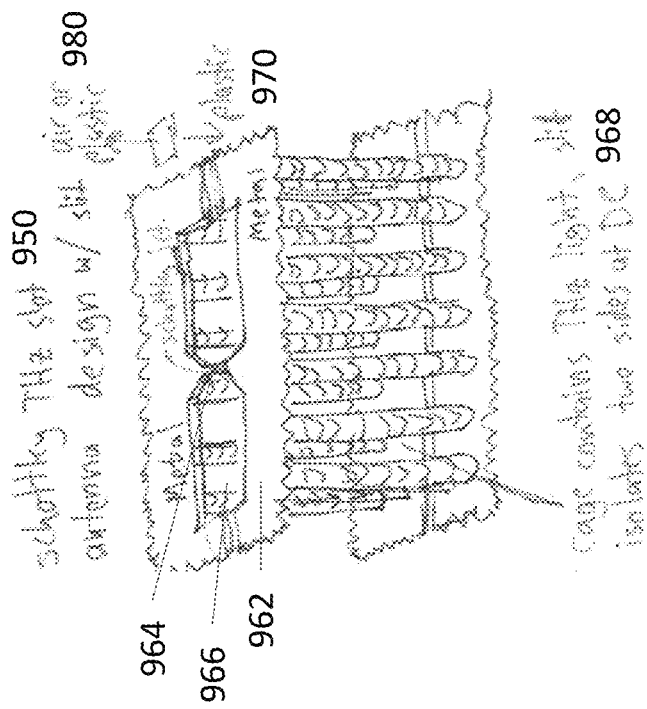
FIG. 9B shows a slot antenna between high- and low-index layers with a Schottky diode between its conductive elements for detecting Terahertz radiation.
Figure 9A:
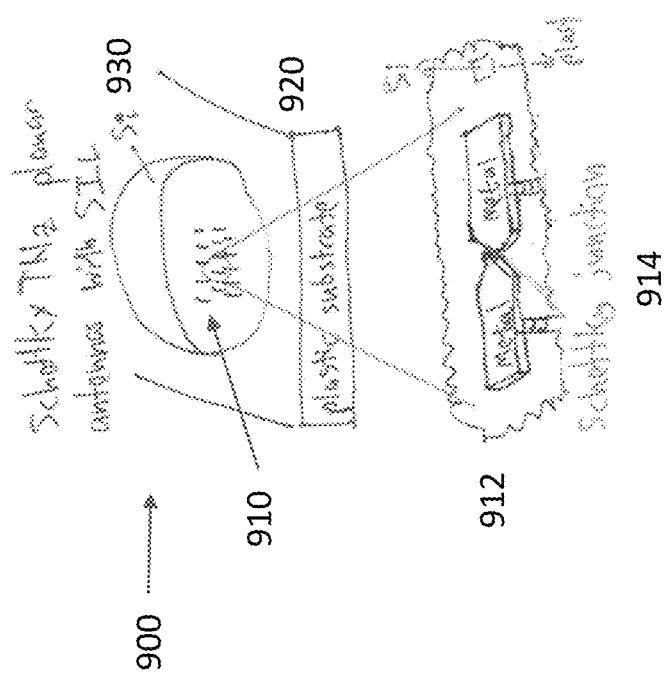
FIG. 9A shows a planar antenna between high- and low-index layers with a Schottky diode between its conductive elements for detecting Terahertz radiation.

FIGS. 9A and 9B illustrate Terahertz antenna arrays like those described above. FIG. 9A shows a THz imager 900 similar to the mid-IR imager 800 shown in FIG. 8. The THz imager 900 includes a 2D array 910 of THz antenna elements 912 integrated with a low-index plastic substrate 920 under a high-index SIL 930. Instead of graphene as the sensing element, each antenna element 912 includes a Schottky diode for detecting radiation at frequencies near 1.5 THz.

FIG. 9B shows a THz version 950 of the slot antenna with a slit shown in FIG. 1G. The THz version has dimensions on the order of 100 µm to 200 µm and has an aperture 966 formed in a metal layer 962. A detecting element 964, such as a Schottky diode, tunnel diode, or graphene FET or HEMT, is suspended above the aperture 966 from the metal layer 962. For graphene FET or HEMT, the antenna is wired to the source and gate and a drain terminal is added, with the drain current representing the detected power. A cage of metal vias 968 in a plastic substrate 970 under the metal layer 962 defines a cavity that contains the resonant radiation and isolates the two sides of the metal plate 962 from each other. The cavity may be filled with air or plastic 980, which may also extend over the metal plate 962, detecting element 964, and aperture 966.

In the Terahertz range, the larger length scales may lead to fabrication paradigms more akin to printed circuit board (PCB) manufacturing than to CMOS manufacturing. Typical transparent materials in the Terahertz include certain polymers, such as TPX plastic, as well as silicon and sapphire. For the <1.5 THz range, Schottky diodes are a viable detection device as shown in FIGS. 9A and 9B.

Reading Out Absorbed Light from a Graphene as an Electrical Signal

As mentioned briefly above, the conductive material in each slot antenna couples light at the slot's resonant wavelength into the graphene patch suspended above the slot. One approach for reading out light absorbed in the graphene patch is via the photothermoelectric effect. This involves engineering a Fermi level $E_F$ step in the graphene patch such that the Seebeck coefficient differs between the two sides of the step. Absorbed light heats the electron gas in the graphene patch, which then produces a thermovoltage due to the Seebeck coefficient difference. This effect is particularly strong in graphene patch due to graphene's extremely low electronic heat capacity and its long electron-phonon scattering times.

There are at least three ways to manipulate the Fermi level $E_F$ of a graphene patch in a slot antenna element. First, Electrons can be pulled into or pushed out of graphene using a nearby electrostatic gate, similar to in a MOSFET. In fact, such graphene devices are commonly referred to as "FETs" regardless of whether the device is intended as an electrical switch or not. Second, an ionic electrolyte may be deposited onto graphene, which sets up an electric double layer on the graphene surface which may be charged or discharged using a remote anode. Third, chemical dopants can be introduced onto a graphene surface, providing electrons or holes.

The first two approaches are used in graphene device demonstrations, perhaps because they allow active tuning of $E_F$. The first approach allows fast $E_F$ modulation, while the second approach is usually limited to modulation rates on the order of Hertz. The electrolyte is encapsulated to prevent deterioration in air. However, it is convenient to implement, as it does not require fabrication of additional conductor and dielectric layers.

FIGS. 10A-10F show cross sections of slot antenna elements with $E_F$ step "doped" into the graphene patches using one or more of the three methods above. FIG. 10A shows a first approach 1000a for doping the graphene patch using the antenna structure itself. This permits a working device with fewer fabrication steps. If a voltage is applied between the slot 130 and the graphene patch 120 through a dielectric 1010 and metal contacts 1002, the regions of the graphene patch 120 directly above metal or doped semiconductor will experience the strongest Fermi level $E_F$ tuning effect. In FIG. 10A, the graphene patch 120 and a supporting dielectric 1010, such as hexagonal boron nitride (hBN), are suspended over the slot 130. Here, the patterned graphene/hBN stack is prepared on another wafer and transferred onto the slot 130, with the graphene patch 120 offset laterally with respect to the slot 130 in order to produce the asymmetric Fermi level profile for a net photovoltage. The graphene patch 120 may or may not also be encapsulated by more hBN for stability (not illustrated).

In the slot antenna 1000b in FIG. 10B, the slot 130 is filled with a relatively mid-IR-transparent dielectric 1012, and the graphene patch 120 is transferred on top of the dielectric 1012 and offset laterally with respect to the slot 130. This case is more suitable when the slot antenna wafer has topography which precludes transferring a whole graphene/dielectric stack, as techniques for conformal graphene transfer exist and may be utilized here. Again, the graphene patch 120 is offset with respect to the slot 130 in order to produce the asymmetric $E_F$ profile for a net photovoltage.

The slot antennas 1000a and 1000b in FIGS. 10A and 10B feature two nonidealities. First, the graphene patch's Fermi level $E_F$ is only tunable on one side of each device. This can be remedied by using an electrolyte 1020 to dope the whole graphene patch 120, as in the slot antenna 1000c in FIG. 10C for the suspended stack case and in the slot antenna 1000d in FIG. 10D for the filled-slot case. However, the electrolyte 1020 should be encapsulated to prevent deterioration and may absorb mid-IR light in some wavelength bands, so using an electrolyte 1020 is not without disadvantages. Second, the electric field of the antenna mode is not centered on the Fermi level $E_F$ step. As a result, the graphene patch's electronic temperature at the $E_F$ step is not as high as if the region of absorbed light were centered, and thus the photovoltage is lower. An alternative view of the problem is that the absorbed light region is close to the left-hand ohmic contact 1002, so the resulting electronic thermal energy is lost more readily by diffusion to the contact. These problems are addressed in slot antennas 1000e and 1000f of FIGS. 10E and 10F, respectively, where a very thin transparent conducting layer 1030 is placed underneath one or both sides of the graphene patch 120 as a gate. In FIG. 10F, there is a back gate on only one side of the graphene patch 120 in case the narrow gap between back gates in FIG. 10E poses trouble for lithography, in which case an electrolyte 1020 may be used to restore two-sided control over the Fermi level $E_F$.

Fabricating Slot Antennas in CMOS Back-End-of-the-Line (BEOL) Wiring

Figure 11:
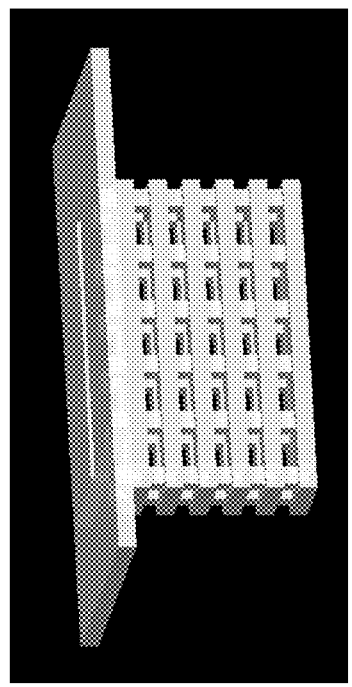
FIG. 11 shows a complementary metal-oxide-semiconductor (CMOS) back-end-of-line (BEOL)-compatible slot antenna with spaces between the vias.

FIG. 11 illustrates a slot antenna made in the copper wiring layers of a CMOS process. Care is taken to prevent oxidization of exposed copper and that the interlayer dielectric (which typically has strong absorption bands in the thermal IR) is removed from inside the slot. Since CMOS back-end-of-line (BEOL) wiring processes include metal patterning layers alternating with via layers, which could include vias of a fixed size, the conductive material that defines the slot takes the form of a mesh. If the perforations or holes in the mesh have cutoff wavelengths below the slot antenna's operating wavelength, they do not leak light, so the slot antenna may support a resonant mode.

One advantage of the design in FIG. 11 is leveraging existing fabrication technology. However, there are few downsides. First, the highest metal layers in a CMOS process typically use masks with a coarser resolution. To achieve a finer resolution, the slot may be buried in lower metal layers to achieve the desired slot width (in the range of 100 nm to 200 nm). Realistically speaking, the first few BEOL layers may be removed from the image-sensing region of each die, introducing considerable topography. Second, since the vias act as a current bottleneck for the antenna mode, there is more loss than for a slot defined by a mesh than for a slot defined by an unbroken or continuous conductive layer.

Modified CMOS BEOL Fabrication

Figure 12:
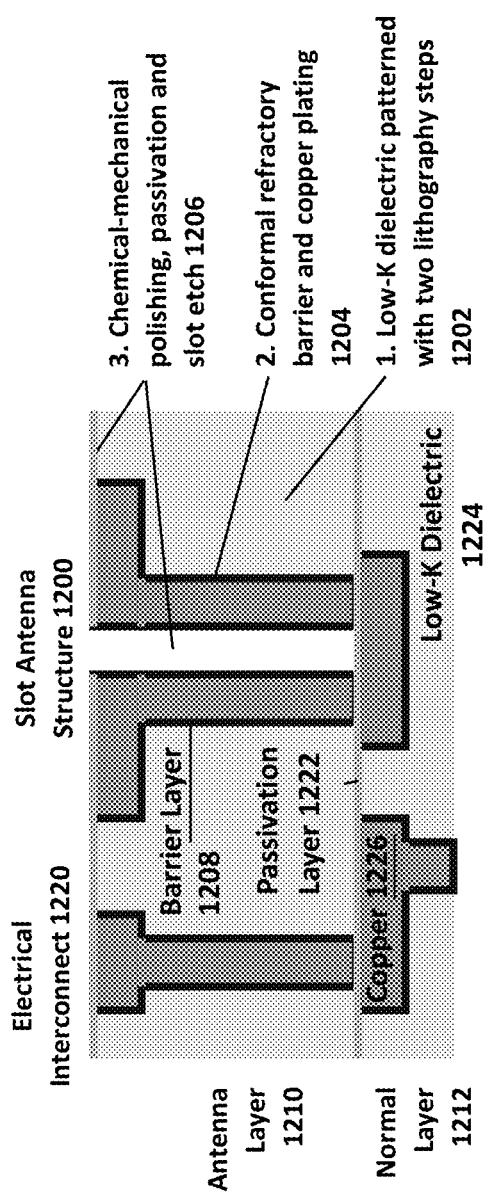
FIG. 12 illustrates a modified CMOS BEOL antenna fabrication process.

FIG. 12 illustrates a slot antenna 1200 made using a modified version of a standard BEOL copper metallization process. The slot antenna 1200 is next to a copper electrical interconnect 1220 in an antenna layer 1210 above a normal CMOS layer 1212. A passivation layer 1222 separates the antenna layer 1210 from the normal CMOS layer 1212, which includes patterned copper 1226 in a low-K dielectric 1224.

A standard BEOL copper metallization process is a dual damascene process where the via and metal patterns are etched in sequence (1202), followed by conformal deposition of a thin diffusion barrier (1208), copper plating (1204), and chemical-mechanical polishing (CMP) (1206). This standard process is modified to fabricate an unbroken conductive layer around a slot within this framework. The slot is a long, deep rectangular "via" with a slit down the middle for the electromagnetic mode to occupy. Due to the high aspect ratio, achieving a good sidewall angle for the dielectric etch and cavity-less plating of the copper can be difficult. Strict design rules for the antenna layout may be used to ensure process reliability. After the plating and CMP, the dielectric inside the metal slot is etched away.

Electrical Interfaces between Graphene Devices and CMOS Interconnects

Figure 13:
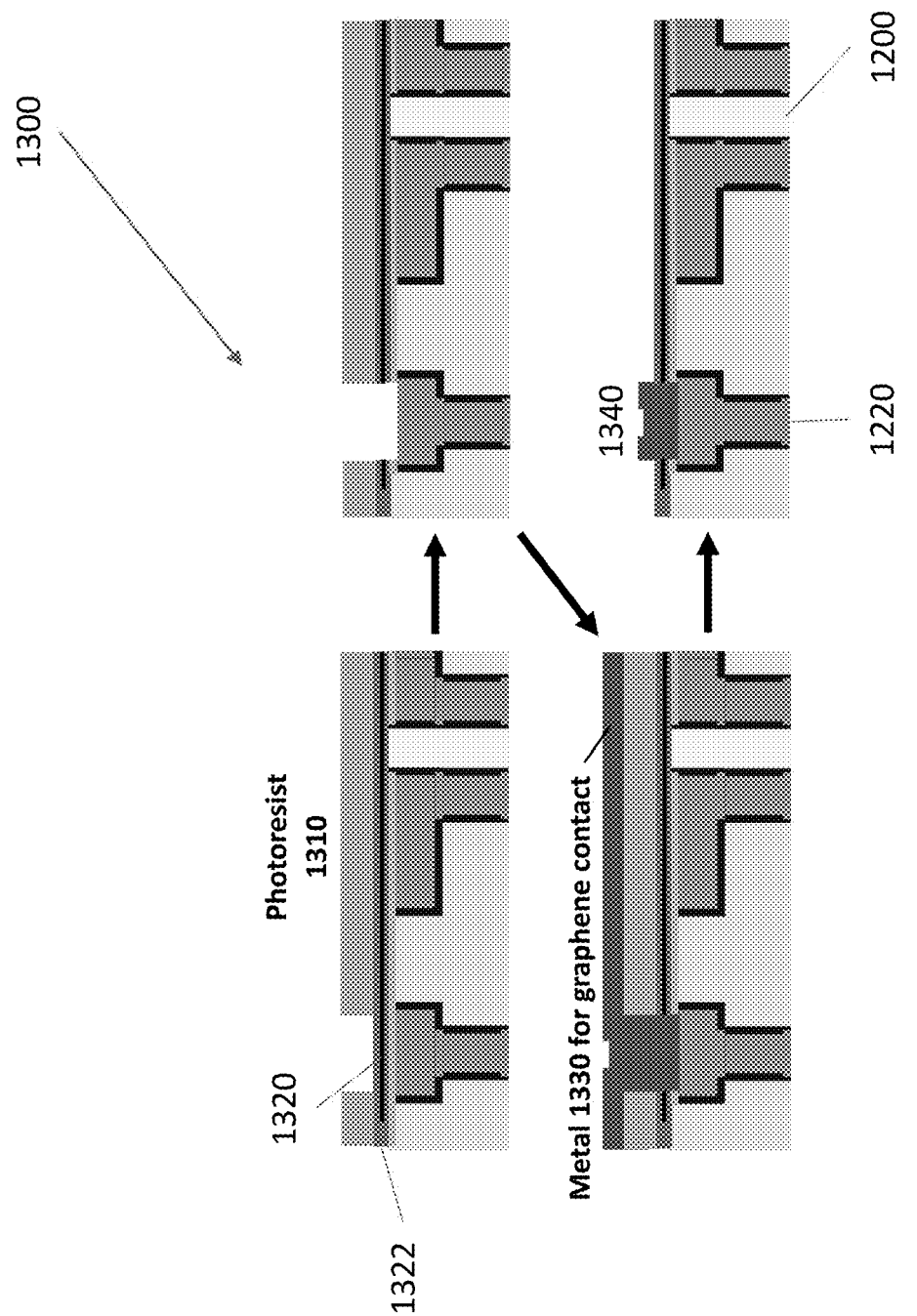
FIG. 13 illustrates a process for contacting graphene to a slot antenna.

FIG. 13 illustrates a process for suspending a patch 1320 of 2D material, such as graphene, HgCdTe, VO$_x$, or a-Si, above the slot of the slot antenna 1200 of FIG. 12. In practice, the patch 1320 may be covered or encapsulated in a dielectric 1322, e.g., a Van der Waals solid such as hBN, to safeguard it from contamination. Taking note of this, the process 1300 shown in FIG. 13 produces an edge contact to the graphene layer in the form of a metal plug 1340. Here, a layer of photoresist 1310 is used to mask the graphene contact plug etch which penetrates through the dielectric 1322, graphene patch 1320, and copper passivation layer. The same resist layer 1310 is then used as a plating mold for the graphene contact metal 1340. The remaining metal and resist can then be etched away.

Subtractive Fabrication

Various approaches for fabricating the slots fall into the category of "subtractive fabrication" where the slots are either etched directly into a layer of conductive material or into an easy-to-etch substrate after which the conductor is conformally deposited (e.g., via atomic layer deposition (ALD)). In the former approach, the material should be amenable to high-aspect-ratio etching; in the latter approach, it should be amenable to ALD and have a skin depth in the low 10's of nm range to prevent light from leaking into the substrate. In both cases, the materials should be suitably low-loss for maximum efficiency. Suitable conductors include metals, heavily doped semiconductors, silicides, and conductive oxides and nitrides. For example, platinum can be the conductor, grown via ALD on slots etched with reactive ion etching (RIE) in silicon, but platinum has a skin depth of 60 nm and is expensive to deposit using ALD.

Figure 14:
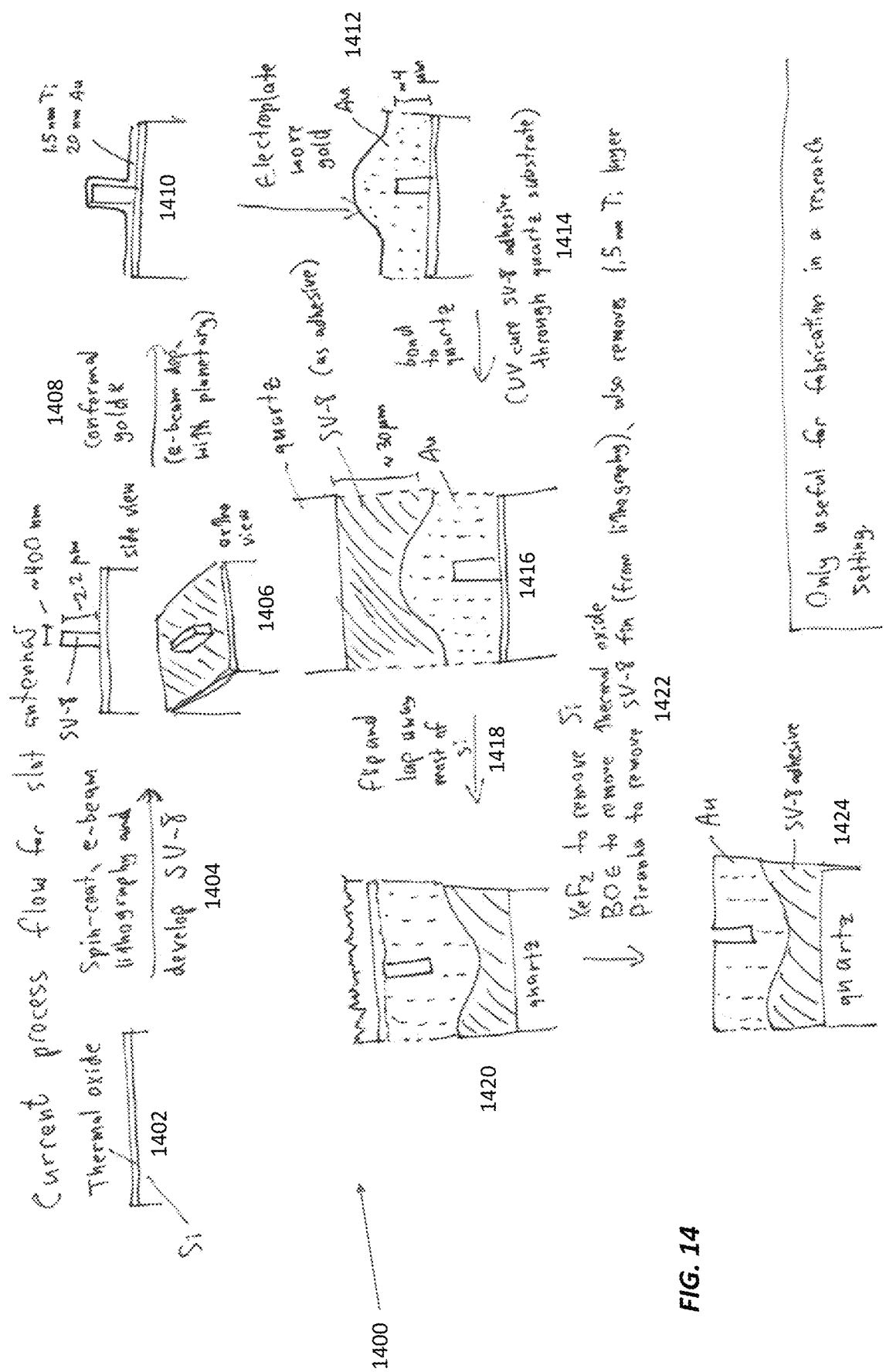
FIG. 14 illustrates an alternative process for making a slot antenna suitable for coupling to a graphene patch.

FIG. 14 shows an alternative process 1400 for making a slot antenna starting from a silicon substrate with a thermal oxide layer (1402). In the first step (1404), SU-8 photoresist is spin-coated onto the thermal oxide layer and lithographically patterned to form a pillar or protrusion roughly the size and shape of the cavity in the slot antenna (1406). This pillar is conformally coated with titanium and gold using electron-beam deposition (1408) to yield thin films of titanium and gold over the pillar (1410). More gold is then electroplated onto the pillar (1412) to form a thicker gold layer over the pillar and the substrate (1414). The gold layer is bonded to a quartz substrate (1416) using SU-8 photoresist as an adhesive (1416). The entire assembly is then flipped over (1418), and most of the silicon is removed to leave the "pillar" facing up on the gold film and quartz substrate (1420). Any remaining silicon and the pillar are etched away (1422) to leave a slot antenna formed of gold surrounding a slot or cavity (1424).

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain, using no more than routine experimentation, many equivalents to the specific inventive embodiments described herein. The foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. An imaging system comprising:
   an array of slot antennas to detect infrared light at a first wavelength, each slot antenna in the array of slot antennas comprising:
      a conductive material defining a three-dimensional slot resonant at the first wavelength;
      a graphene patch suspended over the three-dimensional slot in electrical communication with the conductive material, the conductive material coupling the infrared light at the first wavelength into the graphene patch; and
      a pair of electrical contacts, in electrical communication with the graphene patch, to sense a thermovoltage caused by absorption of the infrared light by the graphene patch.

2. The imaging system of claim 1, wherein at least a portion of the conductive material is formed as a mesh of conductive traces patterned in a complementary metal-oxide-semiconductor (CMOS) process.

3. The imaging system of claim 1, wherein the three-dimensional slot has a width, a length, and a depth each less than the first wavelength.

4. The imaging system of claim 1, wherein the graphene patch is offset with respect to the three-dimensional slot to introduce asymmetry into a Fermi level profile of the graphene patch.

5. The imaging system of claim 1, further comprising at least one of:
   an electrolyte, a transparent conductor, or a dopant, in electrical communication with the graphene patch, to shift a Fermi level of the graphene patch.

6. The imaging system of claim 1, wherein each slot antenna is a first slot antenna and the array of slot antennas is an array of first slot antennas, and further comprising:
   an array of second slot antennas, interleaved with the array of first slot antennas, to detect infrared light at a second wavelength different that the first wavelength.

7. The imaging system of claim 6, wherein each second slot antenna in the array of second slot antennas comprises:
   a conductive material defining a three-dimensional slot resonant at the second wavelength;
   a graphene patch suspended over the three-dimensional slot in electrical communication with the conductive material, the conductive material coupling infrared light at the second wavelength into the graphene patch; and
   a pair of electrical contacts, in electrical communication with the graphene patch, to sense a thermovoltage caused by absorption of the infrared light at the second wavelength by the graphene patch.

8. The imaging system of claim 6, wherein the array of first slot antennas and the array of second slot antennas have pitches less than the first wavelength and less than the second wavelength.

9. A method of imaging with an imaging system comprising an array of slot antennas, each slot antenna in the array of slot antennas comprising a conductive material defining a three-dimensional slot resonant a first wavelength, a graphene patch suspended over the three-dimensional slot in electrical communication with the conductive material, and a pair of electrical contacts in electrical communication with the graphene patch, the method comprising, at each slot antenna in the array of slot antennas:
   coupling infrared light at the first wavelength into the graphene patch disposed over the three-dimensional slot defined by the conductive material;
   absorbing the infrared light by the graphene patch; and
   sensing, with the pair of electrical contacts, a thermovoltage generated by the graphene patch in response to absorption of the infrared light.

10. The method of claim 9, further comprising:
    tuning a Fermi level of the graphene patch.

11. The method of claim 9, wherein:
    the array of slot antennas is a first array of slot antennas resonant at the first wavelength and the imaging system further comprises a second array of slot antennas comprising second slot antennas resonant at a second wavelength different than the first wavelength, and
    coupling infrared light into the graphene patch comprises coupling infrared light at the first wavelength into the graphene patches in the first slot antennas and coupling infrared light at the second wavelength into graphene patches in the second slot antennas.

* * * * *